(12) United States Patent  
Yamada

(10) Patent No.: US 8,593,061 B2
(45) Date of Patent: Nov. 26, 2013

(54) ELECTRO-OPTICAL DEVICE AND ELECTRONIC APPARATUS

(75) Inventor: Tadashi Yamada, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 321 days.

(21) Appl. No.: 12/868,216

(22) Filed: Aug. 25, 2010

(65) Prior Publication Data

US 2011/0050657 A1  Mar. 3, 2011

(30) Foreign Application Priority Data

Aug. 25, 2009 (JP) ................................ 2009-193940
Aug. 25, 2009 (JP) ................................ 2009-193941

(51) Int. Cl.
*H01L 51/00* (2006.01)
(52) U.S. Cl.
USPC ......................................... 313/512; 313/503
(58) Field of Classification Search
USPC ............................................... 313/498–512
See application file for complete search history.

(56) References Cited

U.S. PATENT DOCUMENTS

| 7,868,323 | B2 | 1/2011 | Shiba et al. |
| 8,063,400 | B2 | 11/2011 | Sugimoto |
| 8,203,261 | B2 | 6/2012 | Tanaka et al. |
| 2007/0033847 | A1 | 2/2007 | Tanaka |
| 2007/0176309 | A1 | 8/2007 | Kanbayashi |
| 2007/0216670 | A1 | 9/2007 | Yatsu et al. |
| 2008/0211398 | A1* | 9/2008 | DeCook et al. ............... 313/506 |
| 2008/0265753 | A1* | 10/2008 | Ricks et al. ................... 313/504 |
| 2008/0309867 | A1* | 12/2008 | Kampstra ..................... 349/158 |

FOREIGN PATENT DOCUMENTS

| JP | A-57-82883 | 5/1982 |
| JP | U-59-106122 | 7/1984 |
| JP | A-2000-275626 | 10/2000 |
| JP | A-2005-019082 | 1/2005 |
| JP | A-2007-072434 | 3/2007 |
| JP | A-2007-233338 | 9/2007 |
| JP | A-2007-248689 | 9/2007 |
| JP | A-2008-147418 | 6/2008 |
| JP | B2-4131639 | 8/2008 |
| JP | A-2009-048007 | 3/2009 |
| WO | WO 2008/123416 A | 10/2008 |

* cited by examiner

*Primary Examiner* — Anne Hines
(74) *Attorney, Agent, or Firm* — Oliff & Berridge, PLC

(57) ABSTRACT

An electro-optical device includes a display panel obtained by forming an electro-optical layer, in which a plurality of pixels is formed, on a glass substrate having a thickness of 50 μm or less; and a support frame supporting the display panel, wherein the display panel has at least a display region in which the plurality of pixels is formed and frame regions formed outside the display region, and wherein at least one side of each of the frame regions is bent from the vicinity of a circumference of the display region to the support frame side and is fixed to the support frame.

20 Claims, 19 Drawing Sheets

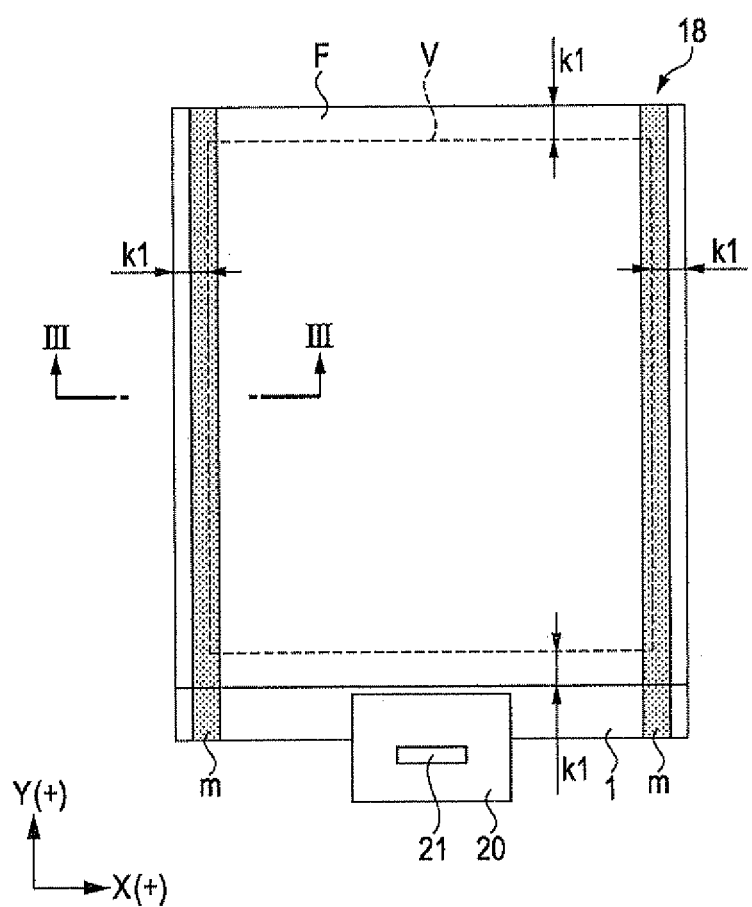

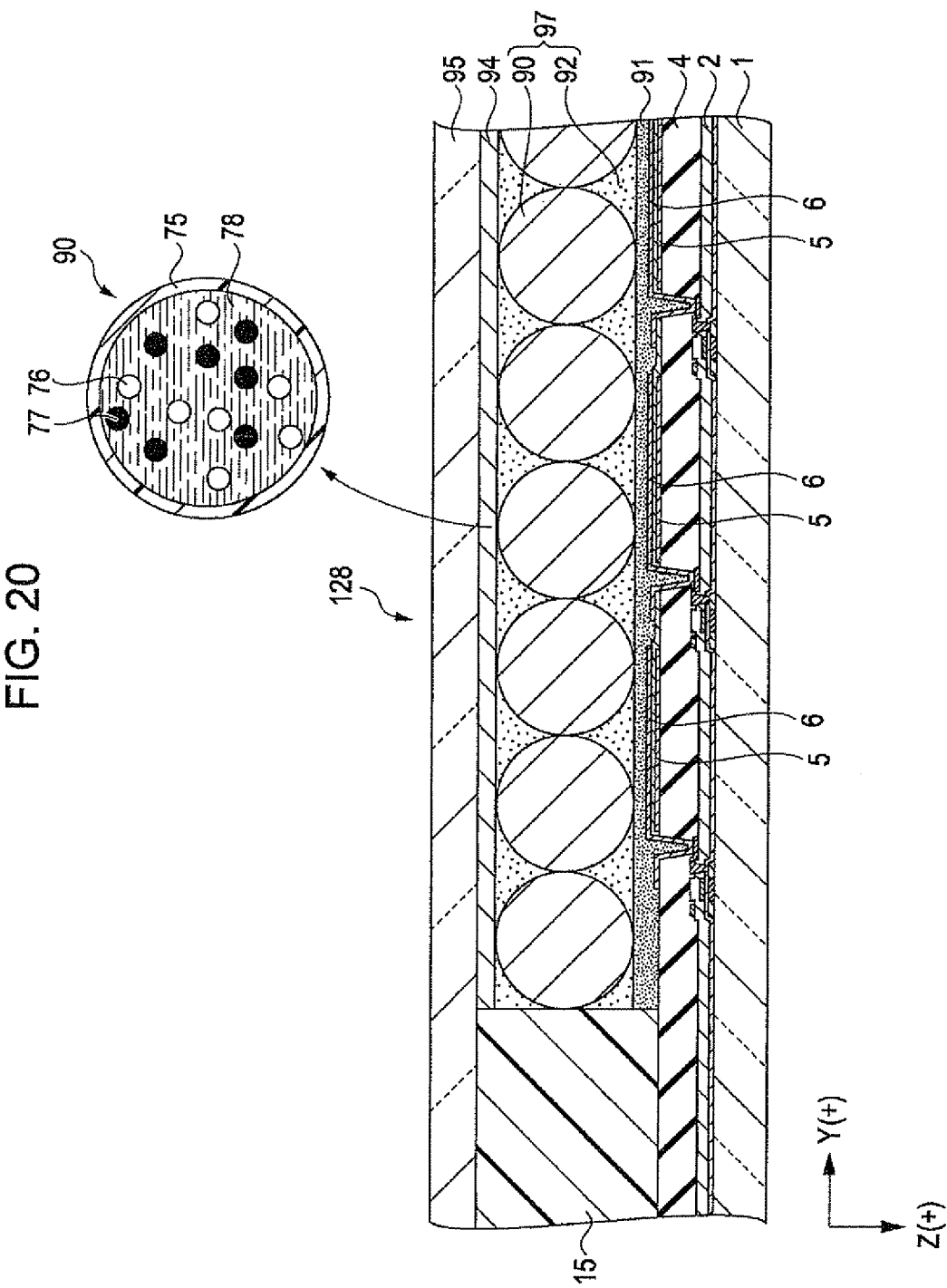

ELECTRO-OPTICAL DEVICE AND ELECTRONIC APPARATUS

CROSS REFERENCES TO RELATED APPLICATIONS

The present invention contains subject matter related to Japanese Patent Application No. 2009-193940 filed in the Japanese Patent Office on Aug. 25, 2009 and Japanese Patent Application No. 2009-193941 filed in the Japanese Patent Office on Aug. 25, 2009, the entire contents of which are incorporated herein by reference.

BACKGROUND

1. Technical Field

The present invention relates to an electro-optical device and an electronic apparatus including the electro-optical device.

2. Related Art

Since an organic electroluminescent (EL) display device which is a self-light emitting device is easily made thin as compared with a liquid crystal display device requiring an illumination device such as a backlight, various applications utilizing thinness and lightness have been proposed.

For example, in JP-A-2005-19082, an organic EL display device in which an organic EL layer is interposed between two glass substrates made thin to 100 μm or less is suggested. According to this display device, the organic EL layer is interposed between two glass substrates with an excellent barrier property so as to suppress permeation by moisture into the organic EL layer and to enhance durability. In addition, the glass substrates are made thin so as to provide flexibility.

In addition, similarly, Japanese Patent No. 4131639 discloses a liquid crystal display device for realizing flexibility by making a glass substrate thin. According to Japanese Patent No. 4131639, when a thin liquid crystal display device is used in a state of being bound into a notebook or a pocket book and the like, although an external force such as dropping or bending is applied, the external force is escaped through taking advantage of the flexibility thus preventing fatal damage such as breaking. The flexibility appropriate to the liquid crystal display device can be conjectured from the terms of the description of the embodiments and the drawings and the like as a degree of pliability of the whole device.

In such a display device, a drive wiring circuit for displaying and driving a plurality of pixels formed in a display region was formed in the circumference of the display region, that is, a frame region.

In the case of the organic EL display device, in order to prevent permeation by moisture from the peripheral portion of the glass substrate, the frame region was lengthened so as to be sufficiently filled with a sealing agent. In other words, the frame region also functioned as a barrier layer so as to secure reliability (lifespan).

On the other hand, as the market demands, frame narrowing has been required. This is because, in an electronic apparatus in which a display device is assembled, the planar size of the electronic apparatus is increased if the frame region is large. In addition, there is a need for a so-called tiling type display device capable of realizing a desired aspect ratio and size by aligning a plurality of display devices, in which frame narrowing is realized.

However, in a display device of the related art, it is difficult to realize frame narrowing. In detail, since there is a trade-off between frame narrowing and reliability securing, it is difficult to secure reliability if the frame region is short and frame narrowing is not realized if a predetermined length of the frame region is secured. In other words, in the display device of the related art, it is difficult to secure reliability and narrow the frame compatibly. Even when the display device has flexibility, since the frame region is not decreased due to flexibility, it is difficult to narrow the frame.

If the frame region is long, the frame region is an obstacle even when tiling is performed. Thus, it is difficult to realize a seamless display and to obtain sufficient display quality. In other words, a tiling type display device capable of realizing a display which suppresses a seam has not been proposed.

In addition, even when the degree of flexibility of the whole display device is provided as in Japanese Patent No. 4131639, the display device is only used to be bound into a notebook or a pocket book and the like. Accordingly, it is difficult to take advantage of the flexibility. In other words, in the display device of the related art, flexibility is only applied to a thin display device, but a new application utilizing the flexibility has not been proposed.

That is, a valid application utilizing the flexibility was not found.

SUMMARY

The invention is realized through the following applications or aspects.

Application

According to an aspect of the invention, there is provided an electro-optical device including: a display panel obtained by forming an electro-optical layer, in which a plurality of pixels is formed, on a glass substrate having a thickness of 50 μm or less; and a support frame supporting the display panel, wherein the display panel has at least a display region in which the plurality of pixels is formed and frame regions formed outside the display region, and wherein at least one side of each of the frame regions is bent from the vicinity of a circumference of the display region to the support frame side and is fixed to the support frame.

According to the findings of the inventors' various experimental results, it can be seen that bending close to a right-angle state is realized by setting the thickness of the glass substrate to 50 μm or less without micro cracks occurring at the circumference. The bending close to the right-angle state indicates a state in which an angle R made by bending is present but it is macroscopically determined that the panel is bent substantially at a right-angle. The present application is derived from researches based on these findings so as to realize frame narrowing by taking advantage of flexibility (bendability).

According to this electro-optical device, since the thickness of the glass substrate on which the electro-optical layer is formed is set to 50 μm or less, the display panel can be bent substantially at a right-angle.

The display panel is fixed to the support frame in a state in which at least one side of each of the frame regions is bent from the vicinity of the circumference of the display region to the support frame side.

That is, since one side of each of the frame regions is bent to the support frame side, it is possible to visually shorten the planar length of the frame regions.

Accordingly, it is possible to provide an electro-optical device capable of realizing frame narrowing.

Since the frame region is bent, the lengths of the frame regions can be set to a length necessary for securing reliability.

Accordingly, it is possible to provide the electro-optical device capable of realizing both reliability securing and frame narrowing.

Since the display panel has a flexibility capable of being bent substantially at a right-angle, it is possible to realize frame narrowing which was potentially and highly required as a market demand.

Accordingly, it is possible to suggest a valid application of the electro-optical device utilizing the flexibility. In other words, it is possible to provide an electro-optical device capable of realizing frame narrowing utilizing the flexibility.

A support portion supporting at least a portion of the display region and a storage portion for storing at least one side of each of the frame regions may be formed in the support frame, and the side may be fixed in a state of being in contact with a sidewall formed in a crossing direction with respect to a surface including the display region of the storage portion.

In the side view, the surface including the display region and the bent portion may be provided such that an angle formed with respect to the bent side is in a range of 90 to 120 degrees, and the bending radius of the glass substrate in the bent portion may be 1.8 mm or less.

At least two facing sides in the display region may be bent.

The support frame may be formed with substantially the same area as the display region in the plan view, and a front-surface adhesive layer for fixing the display panel may be placed on a surface of the display panel side of the support frame and a side-surface adhesive layer for fixing the frame regions may be placed on a side surface of the support frame.

The support frame may be a plate-shaped member formed of metal, and the lengths of the frame regions may be 2 mm or more.

The frame regions may be formed so as to extend from the side to the outside of the display region in every side of the display region, a notched portion may be formed between neighboring frame regions on the outside of the display region, and all the frame regions may be bent.

The electro-optical device may further include a tape member or a bezel for pressing the bent portion from the outside to the side surface of the support frame.

According to another aspect of the invention, an electro-optical device including: a display panel obtained by forming an electro-optical layer, in which a plurality of pixels is formed, on a glass substrate having a thickness of 50 μm or less; and a support substrate supporting the display panel, wherein, when a surface of the display panel side of the support substrate is a front surface and a surface opposed to the front surface is a rear surface, at least one side of each frame region formed on the outside of the display region, in which the plurality of pixels is formed, of the display panel is folded back from the vicinity of a circumference of the display region to the rear surface side of the support substrate.

A front-surface adhesive layer for adhering the display panel and supporting the display panel may be provided on the front surface of the support substrate and a rear-surface adhesive layer for adhering the folded-back side may be provided on the rear surface, and the bending radius of the glass substrate in the folded-back portion may be substantially equal to half a thickness obtained by adding the thicknesses of the front-surface adhesive layer and the rear-surface adhesive layer to the thickness of the support substrate.

When the glass substrate is a first substrate, the display panel may further include a second substrate formed of a glass substrate having substantially the same thickness as the first substrate and the electro-optical layer may be interposed between the first substrate and the second substrate.

The electro-optical device may further include a resin film which covers and laminates the display panel from the first substrate side and the second substrate side.

The frame regions may be formed so as to extend from the side to the outside of the display region in every side of the display region, a notched portion may be formed between neighboring frame regions on the outside of the display region, and all the frame regions may be folded back.

A pixel circuit including a driving circuit for displaying and driving the plurality of pixels may be formed the frame regions of the display panel, and a wiring portion for connecting the pixels and the pixel circuit is formed in the folded-back portion.

The lengths of the frame regions may be 2 mm or more.

The electro-optical layer may be an organic EL layer including an organic light emitting layer.

According to another aspect of the invention, there is provided an electronic apparatus including the electro-optical device as a display portion.

According to another aspect of the invention, there is provided an electronic apparatus including a display unit having a plurality of electro-optical devices, wherein the plurality of electro-optical devices is tiled and placed such that the bent portions or the folded-back portions are adjacent to each other.

According to another aspect of the invention, there is provided an electronic apparatus including a plurality of electro-optical devices, including a display unit having a plurality of first electro-optical devices in which the bezel is placed on an upper side which is the display panel side in the side surface and a plurality of second electro-optical devices in which the bezel is placed on a lower side opposed to the upper side in the side surface, wherein, when the first electro-optical devices and the second electro-optical devices are aligned, the respective bezels are arranged so as not to be superposed in a planar direction, and wherein the first electro-optical devices and the second electro-optical devices are alternately tiled and placed.

According to another aspect of the invention, there is provided an illumination device including: a panel including a light emitting layer formed on a glass substrate with flexibility; and a support frame supporting the substrate, wherein the panel includes a light emitting region for irradiating light emitted from the light emitting layer and frame regions formed on the outside of the light emitting region, and wherein at least one side of each of the frame regions is bent from the vicinity of a circumference of the light emitting region to the support frame side and is fixed to the support frame.

BRIEF DESCRIPTION OF THE DRAWINGS

The invention will be described with reference to the accompanying drawings, wherein like numbers reference like elements.

FIG. 2 is a plan view of a display panel.

FIG. 20 is a side cross-sectional view of a display panel of Modified Example 3.

DESCRIPTION OF EXEMPLARY EMBODIMENTS

Hereinafter, embodiments of the invention will be described with reference to the drawings. In each view used for the following description, the scale of each layer or each portion is differentiated from each other in order that each layer or each portion has a size capable of being identified in the view.

Embodiment 1

Overview of Display Device

Figure 1A:
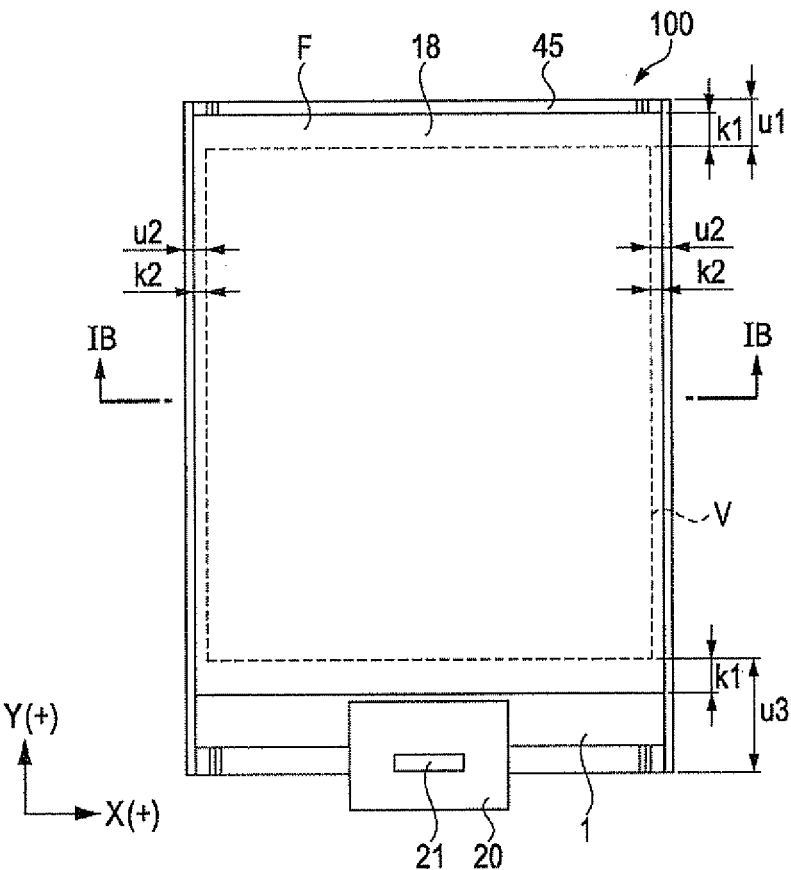
FIG. 1A is a plan view showing a display device according to Embodiment 1.
Figure 1B:
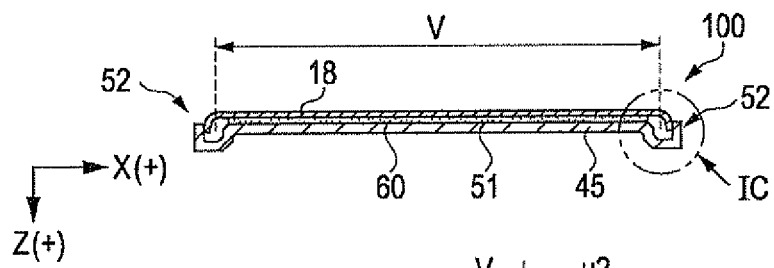
FIG. 1B is a side cross-sectional view taken along line IB-IB.
Figure 1C:
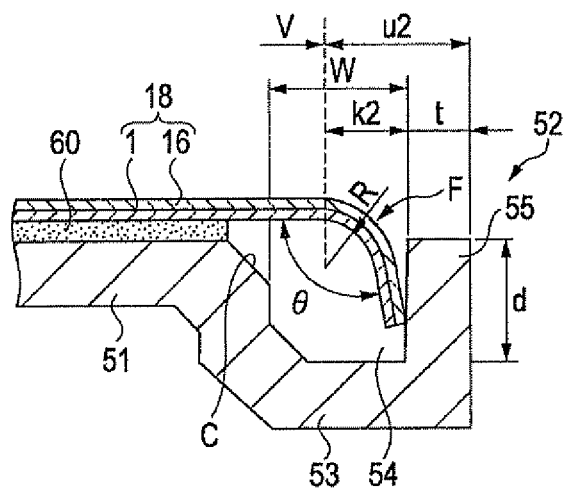
FIG. 1C is an enlarged view of an IC portion of FIG. 1B.

FIG. 1A is a plan view showing a display device according to the present embodiment, FIG. 1B is a side cross-sectional view taken along line IB-IB, and FIG. 1C is an enlarged view of an IC portion of FIG. 1B.

First, the overview of the display device 100 as an electro-optical device according to Embodiment 1 of the invention will be described.

The display device 100 is a thin organic EL display device and includes a support frame 45 and a display panel 18 set on the support frame. The display panel 18 is an organic EL panel obtained by interposing an organic EL layer between a pair of glass substrates made sufficiently thin and has a flexibility capable of being bent substantially at a right-angle. In addition, the thickness or the flexibility of the glass substrate will be described later.

The display panel 18 includes a display region V including a plurality of pixels arranged in a matrix. In the display region V, color pixels of red (R), green (G) and blue (B) are periodically arranged, and a full-color image is displayed by display light emitted by each pixel. In addition, the display panel is not limited to the display panel for performing a color display and a display panel for performing a monochrome display may be used. The display region V has a vertically long rectangular shape, and, in the diagrams including FIG. 1, a vertical direction is defined as a Y-axis direction and a horizontal direction shorter than the vertical direction is defined as an X-axis direction. In addition, the thickness direction of the display panel 18 is a Z-axis direction. In addition, (+) and (−) directions of the Y axis are defined as upper and lower directions and (−) and (+) direction of the X axis are defined as left and right directions.

The outer shape of the display device 100 has a vertically long rectangular shape rather than the display region V.

Here, the length (width) from the display region V to the outer shape in the horizontal direction is shorter (narrower) than that in the vertical direction. In other words, the frame is narrowed in the horizontal direction.

In detail, both the lengths from the display region V to the left and right sides of the outer shape in the horizontal direction are a length u2, and the length u2 is shorter than the length u1 from the display region V to the upper side of the outer shape and the length u3 from the display region V to the lower side of the outer shape in the vertical direction.

In particular, since the length u2 of the frame in the horizontal direction is equal to or less than half the length u1, the display device 100 in which the frame is narrowed in the horizontal direction may be suitably used when the horizontal direction is made clear in design, when the display device is arranged in parallel in the horizontal direction, or the like.

The frame narrowing in the horizontal direction is realized by storing the left and right sides of a frame region F of the display panel 18 in a storage portion 52 of the support frame 45 in a state of being bent, as shown in FIGS. 1B and 1C. In detail, in the display panel 18, the rear surface of the display region V is fixed to a support portion 51 of the support frame 45 by an adhesive layer 60 and the left and right sides of the frame region F are set on the support frame 45 in a state of being bent substantially at a right-angle on a Z-axis side.

The left and right sides are stored in a state of being bent substantially at a right-angle such that the length of the left and right frame region F in the plan view is shortened and frame narrowing in the horizontal direction is realized. The shortening of the length of the frame region in plan view by bending the frame region F is called frame narrowing. In addition, although an example of narrowing the frame of the two left and right sides of the frame region F is described as a suitable example in the present embodiment, the invention is applicable to frame narrowing of one side or more according to design or use.

Detailed Configuration of Display Panel

FIG. 2 is a plan view of a display panel, which corresponds to FIG. 1A.

Subsequently, the detailed configuration of the display panel will be described with reference to FIGS. 1 and 2.

FIG. 2 is a plan view of the display panel 18 in a single item state, in which the two left and right sides of the frame region F extend. In other words, the flat display panel before being set on the support frame 45 is shown.

The display panel 18 is obtained by adhering a device substrate 1 and a counter substrate, both of which are formed of glass substrates, and an extension region in which the device substrate 1 extends from the counter substrate is formed on a lower side thereof.

A flexible substrate 20 is connected to the extension region. In addition, the flexible substrate is the abbreviation for a flexible printed circuit substrate having bendability, in which an iron-foil wiring or the like is formed on a polyimide film base material. In addition, a driving Integrated Circuit (IC) 21 is mounted on the flexible substrate 20 and a plurality of terminals for connection with a dedicated controller or an external device (both of which are not shown) is formed on an end thereof.

The display panel 18 receives a control signal including power or an image signal supplied from the external device through the flexible substrate 20 so as to display images, characters or the like, on the display region V.

In the present embodiment, a frame-shaped area from the display region V to the outer shape of the display panel 18 is set to the frame region F. In addition, in the extension region side, a portion in which the device substrate 1 and the counter substrate are superposed on the outside of the display region V is set to the frame region F. In other words, the frame-shaped region excluding the display region V in the portion in which the device substrate 1 and the counter substrate are superposed is defined as the frame region F.

As shown in FIG. 2, in an initial state, all the lengths of the four sides of the frame region F are equally set to a dimension k1. When the two left and right sides among the four sides are bent and the display panel 18 is set on the support frame 45, as shown in FIG. 1A, both the lengths of the two left and right sides in plan view is a dimension k2.

In addition, in FIG. 2, portions denoted by dot hatching along the left and right sides of the display panel 18 are portions curved by bending when the display panel is set on the support frame 45 and are defined as curved areas m. In addition, bending indicates bending at 0 degrees or more with respect to a reference surface of the X-axis direction.

Figure 3:
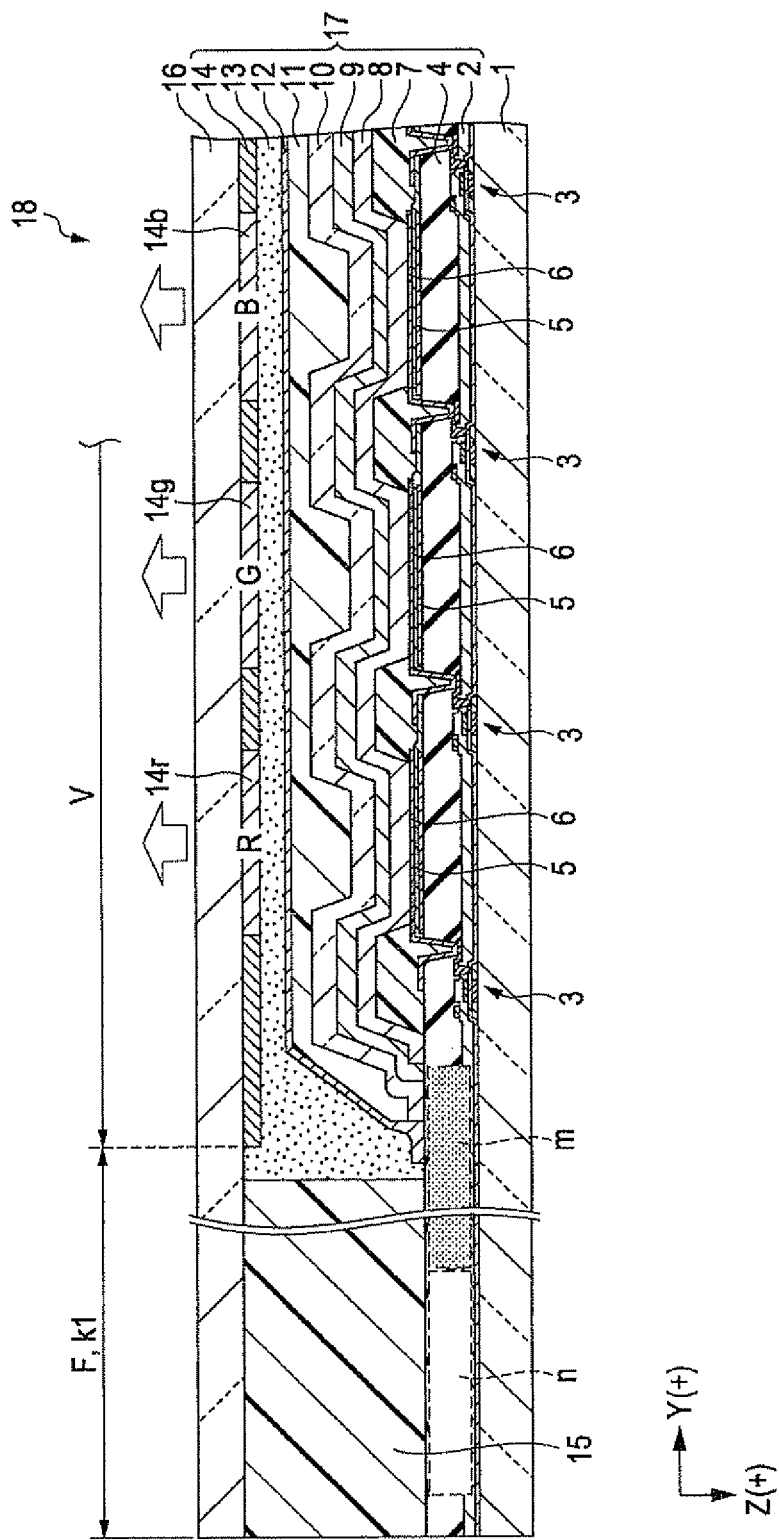
FIG. 3 is a side cross-sectional view taken along line III-III of FIG. 2 and line III-III of FIG. 10.

FIG. 3 is a side cross-sectional view taken along line III-III in the display panel 18 of FIG. 2.

The display panel 18 includes the device substrate 1, a device layer 2, a planarization layer 4, pixel electrodes 6, a partitioning wall 7, an organic EL layer 8 functioning as an electro-optical layer, a common electrode 9, an electrode protective layer 10, a buffer layer 11, a gas barrier layer 12, a filler 13, a CF layer 14, the counter substrate 16, and the like. In addition, a portion interposed between the device substrate 1 and the counter substrate 16 is called a functional layer 17. In other words, a lamination structure from the device layer 2 to the CF layer 14 is called the functional layer 17.

The device substrate 1 is formed of transparent inorganic glass. In the present embodiment, as a suitable example, alkali-free glass is used.

In the device layer 2, a pixel circuit for active-driving each pixel is formed. In the pixel circuit, a selection transistor for selecting the pixel formed of a Thin Film Transistor (TFT), a driving transistor 3 for flowing current to the organic EL layer 8 and the like are included, and the pixel circuit is formed in each pixel. In addition, in the pixel circuit, although low-temperature polysilicon is used in an active layer as a suitable example, amorphous silicon may be used as the active layer.

The planarization layer 4 which is an insulating layer formed of acrylic resin or the like is formed on the upper layer (the (−) direction of the Z axis) of the device layer 2.

Reflection layers 5 and the pixel electrodes 6 are partitioned in each pixel and sequentially laminated on the upper layer of the planarization layer 4. The reflection layers 5 are, for example, reflection layers formed of aluminum or the like and reflect light directed from the organic EL layer 8 to the device substrate 1 side so as to enable the light to be contributed to the display.

Each pixel electrode 6 includes a transparent electrode such as Indium Tin Oxide (ITO), ZnO or the like and are connected to a drain terminal of the driving transistor 3 of the device layer 2 by a contact hole penetrating the planarization layer 4 in each pixel.

The partitioning wall 7 is formed of a photo-curable black resin or the like and divides the pixels in plan view in a lattice shape. In addition, the pixel circuit including the driving transistor 3 in the device layer 2 is arranged so as to be superposed on the partitioning wall in plan view, in order to prevent malfunction due to light.

The organic EL layer 8 is formed so as to cover the pixel electrodes 6 and the partitioning wall 7. Although the organic EL layer includes one layer in FIG. 3, actually, the organic EL layer includes a hole transport layer formed of an organic thin film, a light emission layer, and an electron injection layer and the like, all of which are sequentially laminated on the pixel electrodes 6. The hole transport layer is formed of a sublimable material such as aromatic diamine (TPAB2Me-TPD, α-NPD).

The light emission layer is formed of an organic light-emission-material thin-film formed of a multilayer for radiating white light formed by a combination of three colors of red, green and blue. The electron injection layer is formed of lithium fluoride (LiF).

The common electrode 9 is a metal thin-film obtained by thinly forming metal such as MgAg so as to transmit light. In addition, in order to lower resistance, a transparent conductive film such as metal oxide such as ZnO or a metal nitride layer such as TiN may be laminated. The common electrode 9 is extended to the curved area m on the outside of the partitioning wall 7, is connected to a wiring for the common electrode (not shown) on the outside of the partitioning wall 7, and is electrically connected to the flexible substrate 20 through the wiring the common electrode.

The electrode protective layer 10 is formed of a transparent material having a function for shielding against moisture by high density, such as $SiO_2$, $Si_3N_4$ or $SiO_xN_y$.

The buffer layer 11 is a transparent organic buffer layer such as thermosetting epoxy resin.

The gas barrier layer 12 is a transparent sealing layer having a function for shielding against moisture by high density, such as $SiO_2$, $Si_3N_4$ or $SiO_xN_y$, and performs a function for preventing permeation by moisture into the organic EL layer 8.

The filler 13 is, for example, a transparent adhesive layer formed of a thermosetting epoxy resin or the like and is filled in an irregular surface between the gas barrier layer 12 and the CF layer 14 so as to adhere the gas barrier layer and the CF layer 14. In addition, the filler performs a function for externally preventing permeation by moisture into the organic EL layer 8.

The counter substrate 16 is formed of the same inorganic glass as the device substrate 1 and the CF layer 14 is formed on the organic EL layer 8 side (the (+) side of the Z axis).

In the CF layer 14, a red color filter 14r, a green color filter 14g and a blue color filter 14b are arranged similarly to the pixel arrangement. In detail, the color filter of each color is placed so as to be superposed on the pixel electrode 6 corresponding thereto, and a light shielding portion denoted by hatching is formed between the color filters. The light shielding portion is formed in a lattice shape so as to be superposed on the partitioning wall 7 in plan view and optically functions as a black matrix.

The counter substrate 16 and the device substrate 1 are adhered and sealed by a sealing agent 15 formed on the circumference of the counter substrate 16. The sealing agent 15, an epoxy-based adhesive, an ultraviolet curing resin or the like is used.

Since the functional layer 17 including the organic EL layer 8 is interposed between the device substrate 1 and the counter substrate 16 formed of the glass substrates with an excellent barrier property after the front surface is covered by the gas barrier layer 12 formed of an inorganic material, the barrier property against permeation by moisture from a thickness (Z-axis) direction is high.

Meanwhile, since the barrier configuration (layer) for preventing permeation by moisture from the circumference of the display panel 18 mainly includes the sealing agent 15 and the gas barrier layer 12, it is possible to enhance the barrier property by increasing the filling length of the sealing agent 15. In other words, it is possible to determine the reliability (lifespan) of the display panel 18 according to the length of the frame region F.

In the frame region F, a circuit portion n including a shift register and an inspection circuit used when a plurality of pixels is displayed and driven, a wiring portion for connecting the circuit portion and the pixel circuit, and the like are formed. The circuit portion n or the wiring portion is formed on the device substrate 1 by the same process as the pixel circuit.

In the two left and right sides of the frame region F, the wiring portion is formed in the curved area m and the circuit portion n is formed in an area excluding the curved area. In other words, the circuit portion n is formed outside the curved area m, in which the wiring portion is formed, on the outside of the partitioning wall 7. The wiring portion includes, for example, an area in which the common electrode 9 and the wiring for the common electrode are electrically connected.

The display light corresponding to the hue of the color filter is emitted from each pixel. For example, in a red pixel, red light is selected from white light radiated by the organic EL layer 8 by the red color filter 14r and is emitted from the counter substrate 16 as read display light. The same is true in the green and blue pixels.

Accordingly, in the display region V, a full-color image is displayed by the display light from the plurality of color pixels emitted from the counter substrate 16.

In addition, the configuration of the display panel 18 is not limited to a top emission type and any configuration in which an electro-optical layer is interposed between two glass substrates may be used. For example, a bottom emission type organic EL display device in which the light generated by the organic EL layer 8 is emitted from the device substrate 1 side may be used. In addition, an inorganic EL display device including an inorganic EL as a light source may be used.

Regarding Dimensions of Portions

Now, the optimal dimensions of the portions necessary to secure initial reliability (lifespan) and to enable the display panel 18 to have the above-described flexibility will be described.

First, the thickness of the display panel 18 will be described.

In FIG. 3, in order to clarify the lamination relationship between the components, in particular, the scale of the functional layer 17 is larger than the other portions, but, actually, the portion of the functional layer 17 is extremely thin. The thickness of the functional layer 17 is about several μm to 20 μm. The thickness of the buffer layer 11 is at least half the thickness of the functional layer 17. In addition, the thickness of the organic EL layer 8 formed of a plurality of thin films each having a thickness of an nm order is less than 1 μm.

In the present embodiment, as a suitable example, each of the thicknesses of the device substrate 1 and the counter substrate 16 is set to about 30 μm. The total thickness of the display panel 18 is set to about 70 μm, as a suitable example. According to the inventors' experimental results, in order to secure reliability of the organic EL panel, it can be seen that the thicknesses of each of the device substrate 1 and the counter substrate 16 needs to be set to about 10 μm or more, in addition to the sealing structure of the gas barrier layer 12 or the like. In other words, by setting each of the thicknesses of the device substrate 1 and the counter substrate 16 to about 10 μm or more, it is possible to secure a sufficient moisture-proof property.

Meanwhile, if each of the thicknesses of the device substrate 1 and the counter substrate 16 exceeds about 50 μm, an allowable bending radius is increased and thus the degree (effect) that the frame narrows is decreased (reduced).

Accordingly, the thickness of each of the device substrate 1 and the counter substrate 16 is preferably set to a range of 10 to 50 μm and is more preferably set to a range of 10 to 30 μm. In addition, the total thickness of the display panel 18 obtained by superposing the device substrate 1 and the counter substrate 16 is preferably set to a range of 30 to 110 μm.

In addition, each of the device substrate 1 and the counter substrate 16 is made thin by polishing or etching a substrate having a thickness of about 0.3 to 0.7 mm in an initial step. Preferably, after manufacturing a large panel in which a plurality of display panels in which the thickness in the front and rear of the glass substrate is thick is attached, a large panel having a desired thickness is manufactured by etching using an etching solution (aqueous solution) in which hydrofluoric acid is melted. The display panel 18 is cut out of the large panel. In addition, the invention is not limited to this method, any method of forming the display panel 18 having a desired thickness may be used, and, for example, a mechanical polishing method may be used.

Here, when the display panel 18 is cut out of the large panel, a known cutout method may be used, but micro cracks need to be prevented from occurring in the circumference of the display panel 18. This is because the display panel 18 is used in a state of being bent and thus breaking needs to be prevented upon bending. Accordingly, in particular, a laser scribing method using laser light is preferably used in the cutout of the side including the curved area m of FIG. 2. After cutout, at least the end of the curved area m needs to be melted in a solution such as hydrofluoric acid so as to eliminate micro cracks.

In order to protect the end surface after cutout, the circumference of the display panel 18 may be coated with resin. For example, the circumference is coated by a dipping method with epoxy resin, acrylic resin, urethane resin, silicon resin or the like.

Figure 4:
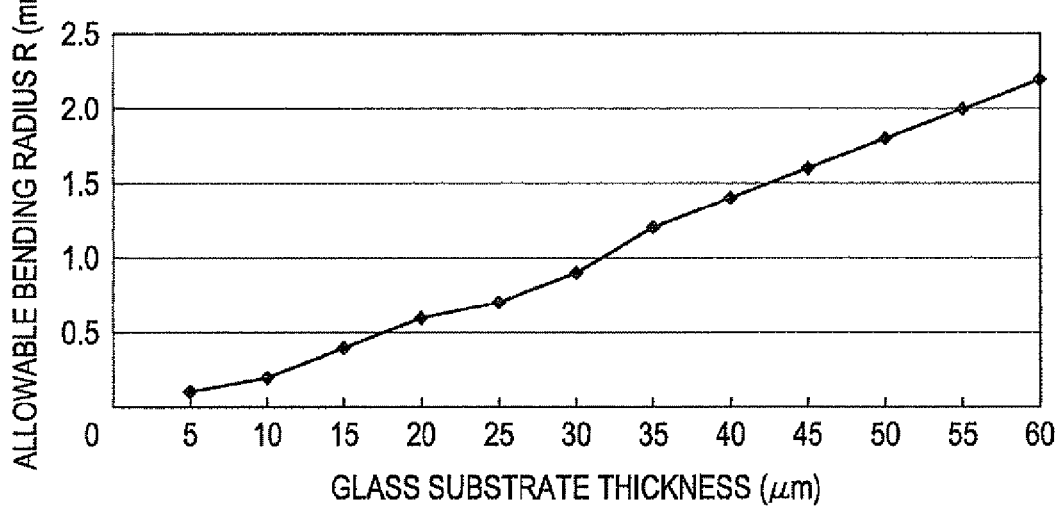
FIG. 4 is a graph showing correlation between glass substrate thickness and an allowable bending radius R.

FIG. 4 is a graph showing correlation between a glass substrate thickness and an allowable bending radius R, in which a horizontal axis denotes the glass substrate thickness and a vertical axis denotes the allowable bending radius R.

This graph is derived from the inventors' various experimental results and is an important index for narrowing the frame. As described above, according to the findings of the inventors' various experimental results, it can be seen that bending close to a right-angle state is realized by setting the thickness of the glass substrate to 50 μm or less.

Although bending close substantially to a right-angle is possible, if the bending radius R is too large, it is difficult to narrow the frame. Accordingly, in the present invention, the frame is narrowed by setting the dimension of each portion using the allowable bending radius R as one index.

The allowable bending radius R is a minimum bending radius R which is allowed when a glass substrate having a predetermined thickness is bent substantially at a right-angle. In other words, the allowable bending radius is a minimum bending radius R in which the bending state can be maintained without breaking when the glass substrate is bent substantially at a right-angle. When the glass substrate is folded back, that is, when the glass substrate is bent by 180 degrees with respect to the X-axis direction as shown in FIG. 6C, the allowable bending radius R is substantially equal to the allowable bending radius R of FIG. 4.

As shown in FIG. 4, the glass substrate thickness and the allowable bending radius R have substantially a direct proportional relationship and thus the allowable bending radius R is increased as the thickness of the glass substrate is increased. In other words, as the thickness of the glass substrate is increased, the degree to which the frame is narrowed is decreased.

FIG. 4 is a graph when the glass substrate without micro cracks is used. However, if a glass substrate including micro cracks is used, the allowable bending radius R is increased extremely even with the same thickness. For example, if a glass substrate including micro cracks with a thickness of 30 μm is used, the allowable bending radius R becomes about 5.5 mm. Thus, it is difficult to narrow the frame.

In the above-described suitable example, the thickness of the glass substrate is 30 μm. In this case, the allowable bending radius R of one glass substrate is about 0.8 mm. In addition, although the actual display panel 18 has a configuration in which two glass substrates are superposed, it can be seen that the allowable bending radius R of this configuration is not equal to the allowable bending radius R when the thickness is 60 μm, but is substantially equal to the allowable bending radius R of one glass substrate, from the inventors' experimental results. This is because the main body of the functional layer 17 (FIG. 3) interposed between two glass substrates is formed of resin such as the sealing agent 15 or the like and thus the layer functions as a buffer layer.

Accordingly, as shown in FIG. 1C, the right one of the frame region of the display panel 18 is bent to the support frame 45 side in a state in which the bending radius R of the inside of the device substrate 1 is about 1.0 mm.

The description returns to FIG. 2.

Subsequently, the dimensional relationship of the display panel 18 in an initial state will be described.

All the lengths k1 of the four sides of the frame region F of the display panel 18 of the suitable example are set to about 3.0 mm. The length is not limited to this value and may be set to 2.0 mm or more according to requirements (reliability)

The description returns to FIG. 1C.

The right frame region F in a state in which the display panel 18 is set on the support frame 45 is bent at an angle θ from the rear surface of the display panel 18 (the planar portion of the outer surface of the device substrate 1) in a state in which the end thereof is in contact with a sidewall 55 of the storage portion 52. That is, in the display panel 18, the left and right sides of the frame region F are bent from the vicinity of the circumference of the display region V to the support frame 45 side. Preferably, the display panel 18 is curved and bent from the curved area m (FIG. 2) to the rear surface side of the display panel 18 and is bent at the angle θ from the rear surface of the display panel 18 (the planar portion of the outer surface of the device substrate 1) in a state in which the end of the frame region F is in contact with the sidewall 55 of the storage portion 52. Although the display panel 18 is curved and bent from the curved area m, the display panel may be bent at a boundary portion between the display region V and the frame region F or may be bent within the display region V if a region used for the actual display is viewed on the front surface of the display panel 18 (the outer surface of the counter substrate 16). The display panel 18 may be bent within the frame region F if the apparent frame region is smaller than that of the related art. In any of these cases, it is possible to narrow the frame of the display panel 18.

The angle θ of a suitable example is set to 110 degrees in consideration of assembling. In addition, the angle is not limited to this value and may be set in a range of 90 to 120 degrees according to the thickness or requirements (frame narrowing) of the display panel 18.

In the present embodiment, the condition for macroscopically determining that the panel is bent substantially at a right-angle is defined as the case where the angle θ is in the range of 90 to 120 degrees and the allowable bending radius R is 1.8 mm or less (the glass substrate thickness is 50 μm or less).

The planar length k2 of the frame region F of a suitable example is about 1.3 mm.

The total thickness of the support frame 45 of a suitable example is about 3.2 mm, and, in the size of the storage portion 52, the thickness t of the sidewall 55 is about 0.2 mm, the width w of a gap portion 54 is about 2.0 mm, and the depth d of the gap portion 54 is about 3.0 mm.

Accordingly, the length u2 from the display region V to the left side of the outer shape of the display panel 18 of a suitable example becomes about 1.5 mm by adding the thickness t of the sidewall 55 to the length k2 of the frame region F, and is about half the length k1 before bending. The same is true in the left side of the frame region F.

The total thickness of the display device 100 of a suitable example is about 3.5 mm.

The dimensions of the suitable example are one suitable example derived from the inventors' experimental results or researches from physical data or the like, but the dimensions are not limited thereto, and the dimensions may be set according to the size or use of the display panel without departing from the technical scope of the present embodiment.

Detailed Configuration of Support Frame

Figure 5:
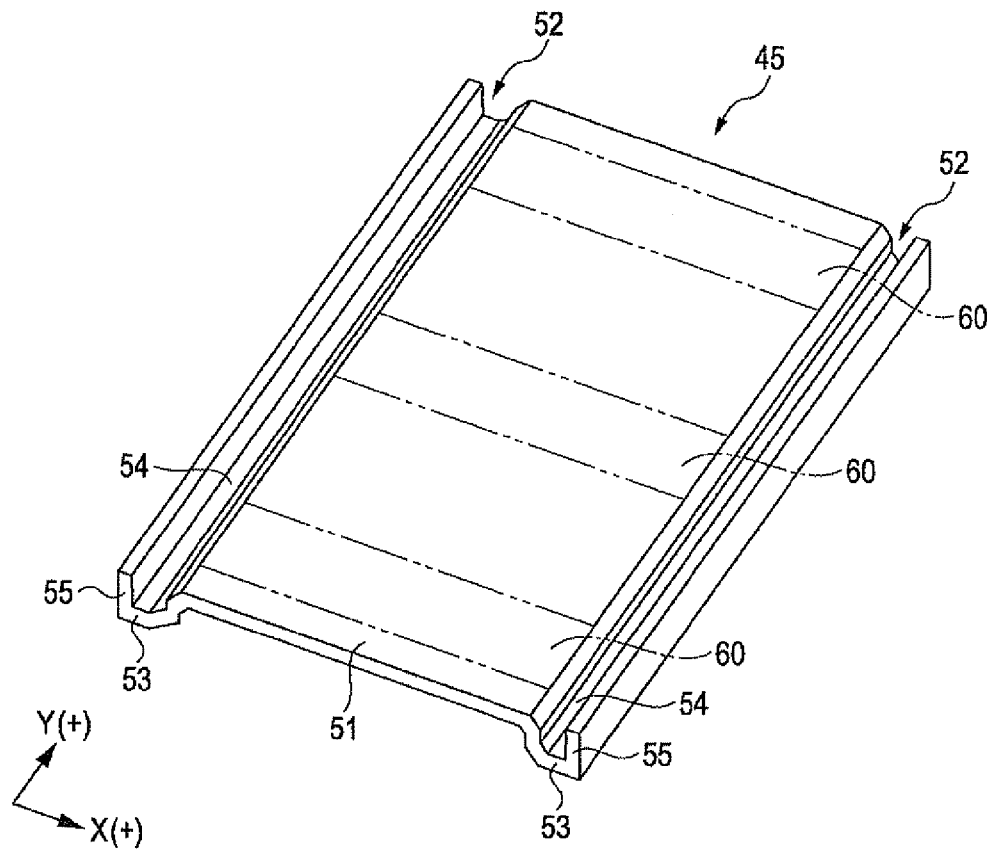
FIG. 5 is a perspective view of a support frame.

FIG. 5 is a perspective view of a support frame.

Now, the detailed configuration of the support frame 45 will be described with reference to FIGS. 1 and 5.

The support frame 45 includes a support portion 51, two storage portions 52, and the like.

The support portion 51 is a planar portion for supporting the rear surface of the display region V of the display panel 18 and the planar portion is a portion of a plane including the X axis and the Y axis. In addition, the support portion is not limited to the support of the entire rear surface of the display region and may have a structure which can support the display region V substantially in a flat state. For example, for a light weight, a plurality of holes may be formed in a central portion of the support portion 51 and the circumference of the display region V may be supported by the main body.

The two storage portions 52 are symmetrically formed on the left and right sides of the support portion 51. In other words, the storage portions 52 which are symmetrical in the horizontal direction are formed with the support portion 51 interposed therebetween.

Each storage portion 52 includes a concave portion 53, a sidewall 55, and the like. The concave portion 53 is a wall portion which is formed so as to be one stage lower (deeper) than the support portion 51. The sidewall 55 is formed in substantially a direction perpendicular to the support portion 51 and is extended in the Y-axis direction. In addition, a chamfered portion C (FIG. 1C) of about 0.5 mm is formed in a corner from the support portion 51 to the concave portion 53.

A groove (space) having a concave shape surrounded by the concave portion 53 and the sidewall 55 is a gap portion 54. The gap portion 54 extends in the Y-axis direction along the sidewall.

The support frame 45 requires strength for reinforcing a sheet-shaped display panel 18 and a function such as a heat radiation property for absorbing heat emitted from the display panel 18 and externally delivering (radiating) the heat, and thinness.

In the present embodiment, as a suitable example, a stainless plate having a thickness of 0.2 mm is pressed so as to form the support frame 45. In detail, SUS304CSP which is a stainless steel band is used. In addition, the support frame is not limited thereto, and, for example, an invar with a small thermal expansion coefficient in the vicinity of a room temperature or a plated steel plate obtained by plating a steel plate, which is formed of SUS301CSP, aluminum or an alloy of iron and nickel, may be used if a material having the above-described functions is used.

The material of the support frame is not limited to metal and the support frame 45 may be formed of resin. If resin is used, in order to secure the strength of the support portion 51, the shape is preferably changed according to the appropriate material characteristics by thickening the portion or inserting a beam or a brace into a back surface. As a molding method, an injection molding method or an extrusion molding method may be used.

As the detailed resin, general resin such as ABS resin may be used, but, from the view point of thinness or toughness, engineering plastic such as polycarbonate, polyacetal, polybutylene terephthalate may be preferably used.

If resin is used, in order to enhance the heat radiation property, the support frame 45 is preferably subjected to surface treatment such as plating, sputtering, or heat radiation coating. If the plating processing is performed, for example, two layers of copper and nickel are plated or three layers of copper, nickel and chrome are plated on the entire surface. If the sputtering processing is performed, aluminum or nickel is sputtered on at least the surface of the support portion 51. If the heat radiation coating is performed, at least the surface of the support portion 51 is coated with a coating material including a heat conductive filler such as aluminum nitride, alumina or silicon carbide.

Manufacturing Method

Now, a method of manufacturing the display device 100 by setting the display panel 18 on the support frame 45 will be described.

First, an adhesive layer 60 which is formed of a double-sided tape is adhered to the support portion 51 of the support frame 45. The thickness of the double-sided tape of a suitable example is set to 0.2 mm. In addition, the thickness of the double-side tape is not limited thereto and may be in a range of 0.1 to 0.5 mm. In addition, the invention is not limited to the adhesion of the double-sided tape to the entire surface of the support portion 51 and the other method may be used if the display region V is supported (fixed) in a flat state. For example, as denoted by a dashed-two dotted line of FIG. 5, band-shaped double-sided tapes extending in the X-axis direction may be located on both ends and substantially the central portion of the display region V in the Y-axis direction such that three tapes are arranged in a stripe shape. According to this configuration, it is possible to suppress generation of air bubbles when the display panel 18 is adhered.

In order to enhance the heat radiation property, a double-sided tape including the above-described heat conductive filler may be used. The adhesive layer is not limited to the double-sided tape and an adhesive having the same adhesive property may be used.

Subsequently, as shown in FIG. 1A, the rear surface of the display region V of the display panel 18 is adhered to the support portion 51 of the support frame 45.

As shown in FIGS. 1B and 1C, the ends are inserted into the storage portions 52 while the left and right sides of the frame region F are curved to the (+) side of the Z axis. Accordingly, the ends of the bent left and right sides are held in a state of being in contact with the sidewalls 55 of the storage portions 52. When the ends are inserted into the storage portions 52, it is preferable that breaking is prevented from occurring due to storage by using a dedicated tool for uniformly grasping the sides of the frame region F.

After the left and right sides of the frame region F are stored in the storage portions 52 in a state in which the overall display panel 18 is curved in an arch shape, the rear surface of the display region V may be attached to the support portion 51.

In this case, the left and right sides of the frame region F are stored in the storage portions 52 and, as shown in FIG. 1C, the radius of the curved surface (bent portion) starting from the circumference of the display region V is maintained at a radius R slightly greater than the allowable bending radius of the glass substrate.

As described above, according to the display device 100 according to the present embodiment, the following effects can be obtained.

Since the thickness of the two glass substrates configuring the display panel 18 is set to 50 μm or less in a state in which micro cracks are not generated in the circumference, the panel can be bent substantially at a right-angle.

The display panel 18 is held in a state in which the left and right sides of the frame region F are bent from the vicinity of the circumference of the display region V to the support frame 45 side in a state in which the rear surface of the display region V is supported by the support portion 51 of the support frame 45 and the ends of the sides are in contact with the sidewalls 55 of the storage portions 52.

That is, since the ends of the frame region F are bent to the support frame 45 side in a state of being in contact with the sidewalls 55 of the storage portions 52, the planar length of the frame region is shortened.

Accordingly, it is possible to provide the display device 100 capable of realizing frame narrowing. In other words, it is possible to provide the display device 100 capable of realizing frame narrowing utilizing the flexibility.

Since each of the thicknesses of the two glass substrates of a suitable example is set to about 30 μm or less, the allowable bending radius R of the display panel 18 becomes about 0.8 mm.

In the display device 100 of a suitable example, the dimension of the storage portion 52 of the support frame 45 is optimized in consideration of the allowable bending radius R and durability of the display panel such that the bending radius R is set to about 1.0 mm and each of the lengths u2 from the display region V to the left and right sides of the outer shape of the display panel 18 is set to about 1.5 mm. This dimension is about half the length k1 (about 3.0 mm) of the frame region F before bending so as to realize frame narrowing in the horizontal direction.

In addition, by bending the frame region F, the length of the frame region F is set to a length necessary for securing reliability.

That is, the frame can be narrowed while the length of the frame region necessary for securing reliability is secured.

Accordingly, it is possible to provide the display device 100 capable of realizing both reliability securing and frame narrowing.

The dimension is not limited to the above dimension and it can be macroscopically deemed that the display panel can be bent substantially at a right-angle if the bending angle θ of the frame region F is in the range of 90 to 120 degrees and the allowable bending radius R is 1.8 mm or less. In other words, it is possible to realize frame narrowing.

Accordingly, it is possible to provide the display device 100 capable of realizing frame narrowing.

Since the wiring portion is selectively formed in the curved area m of the frame region F and the circuit portion n is formed in a region excluding the area, it is possible to prevent the circuit portion n from being damaged by bending.

Accordingly, it is possible to provide the display device 100 with high reliability.

Since the support frame 45 is formed using the stainless plate with a thermal expansion coefficient higher than that of resin or glass, heat emitted from the display panel 18 can be absorbed and externally radiated in an efficient fashion. In addition, the thickness of the material can be reduced, as compared with the case where the support frame is formed of resin. In particular, since the sidewall 55 is configured to be thin, it is possible to realize frame narrowing with certainty.

Accordingly, it is possible to provide the display device 100 capable of realizing frame narrowing and an excellent heat radiation property.

Since the support frame 45 can be efficiently manufactured by press working, it is possible to suppress the cost of parts.

In addition, it is possible to reduce the total thickness (from the bottom of the storage portion to the upper surface of the display panel 18) of the display device 100 of a suitable example to about 3.5 mm. As shown in FIG. 1B, since the rear surface of the support portion 51 has a dented shape (space), the space can be efficiently used when being assembled into an electronic apparatus.

Embodiment 2

Figure 6A:
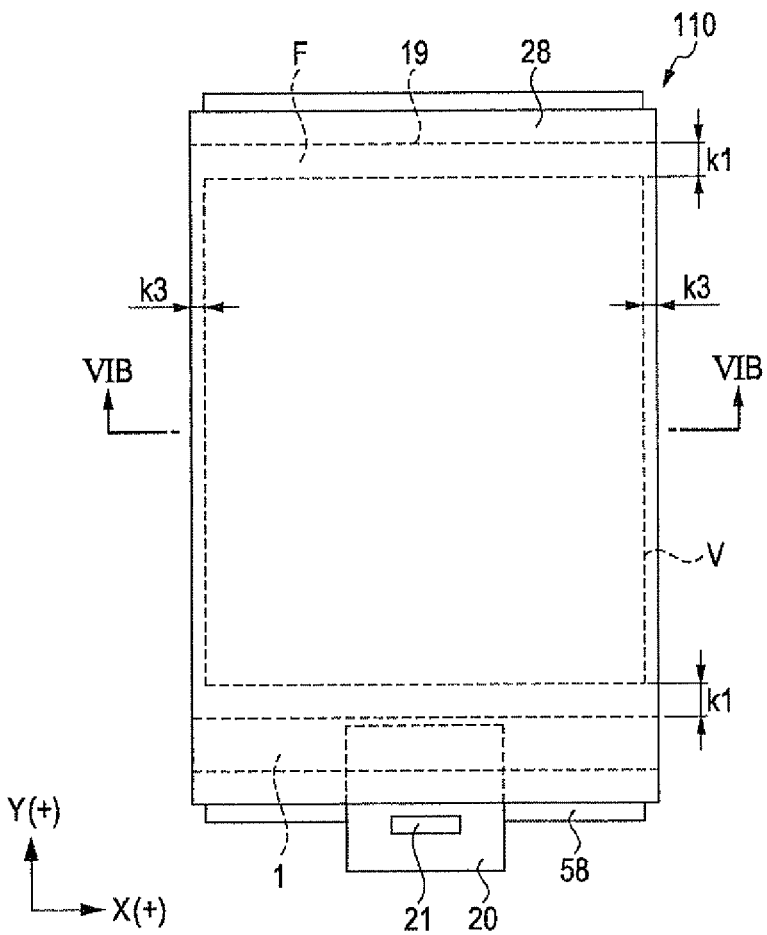
FIG. 6A is a plan view showing a display device of Embodiment 2.
Figure 6B:
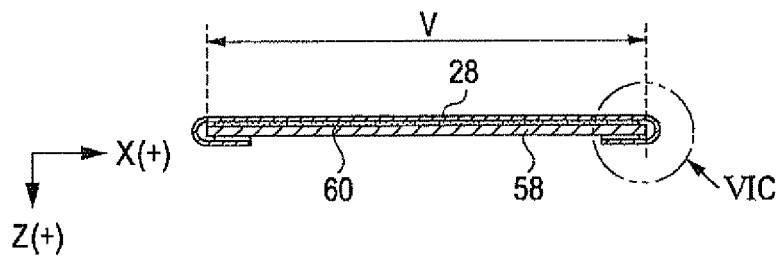
FIG. 6B is a side cross-sectional view taken along line VIB-VIB of FIG. 6A.
Figure 6C:
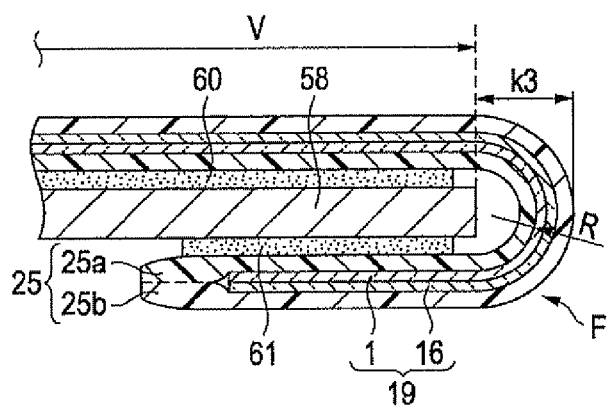
FIG. 6C is an enlarged view of a VIC portion of FIG. 6B.
Figure 7A:
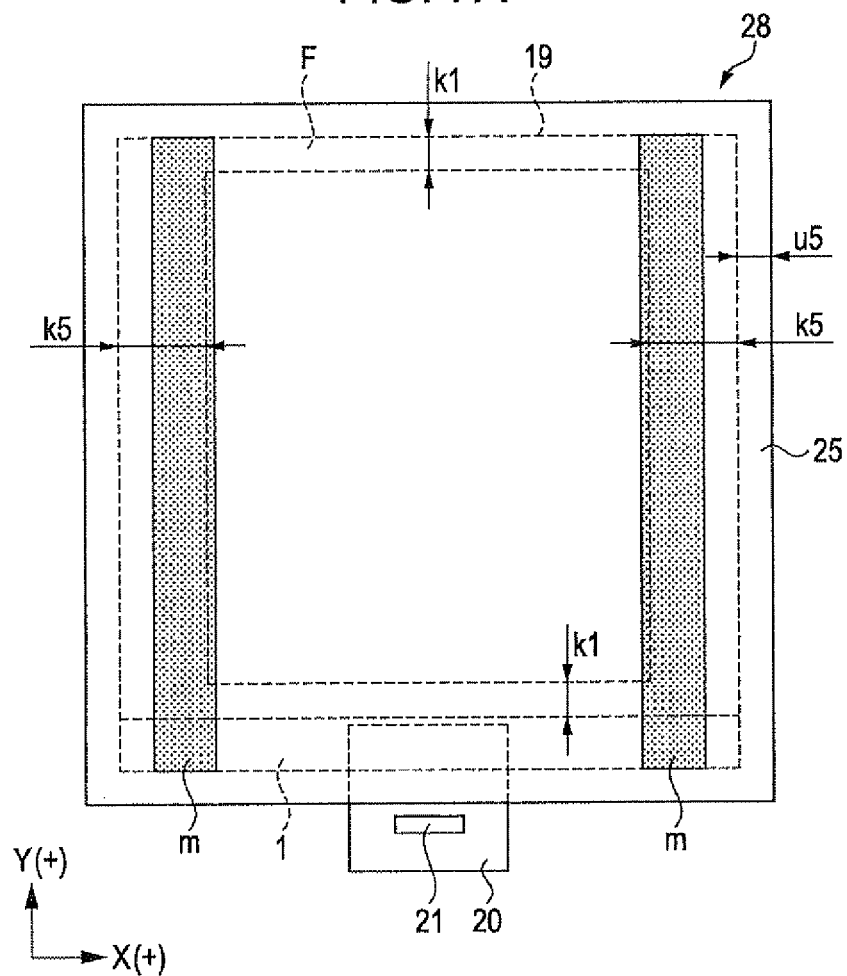
FIG. 7A is a plan view of a display panel in a single item state.

FIG. 6A is a plan view showing a display device of Embodiment 2, FIG. 6B is a side cross-sectional view taken along line VIB-VIB of FIG. 6A, and FIG. 6C is an enlarged view of a VIC portion of FIG. 6B. FIGS. 6A to 6C correspond to FIGS. 1A to 1C, respectively. FIG. 7A is a plan view of a display panel, which corresponds to FIG. 2.

Hereinafter, a display device 110 according to Embodiment 2 of the invention will be described. In addition, the same components as Embodiment 1 are denoted by the same reference numerals and the description thereof will be omitted.

The display device 110 of the present embodiment is a display device capable of realizing frame narrowing, by employing a structure in which the left and right frame regions are folded back using a display panel 28 having a structure in which a display panel 19 obtained by increasing the horizontal width of the display panel 18 of Embodiment 1 is laminated by resin films from the front and rear surfaces thereof.

The display device 110 includes a support substrate 58, the display panel 28, and the like.

The support substrate 58 is a metal flat plate of which the horizontal width (the length of the X-axis direction) is substantially equal to the horizontal width of the display region V of the display panel 19 and the vertical length is slightly longer than the outer length of the display panel 19. In the present embodiment, as a suitable example, an aluminum plate is used. In addition, the material of the support substrate plate is not limited to this material and various metals described in Embodiment 1 may be used. Various resins described in Embodiment 1 may be used or a resin plate subjected to various surface treatments such as plating may be used.

As shown in FIG. 6C, the display panel 28 has a structure in which the display panel 19 is laminated by resin films 25a and 25b from a surface of the counter substrate 16 side and a surface of the device substrate 1. In other words, the resin films 25a and 25b for laminating the display panel 19 from the front and rear surfaces thereof are included. Since the resin films 25a and 25b after laminating are integrally formed with the display panel 19, a laminate by the two resin films is called a laminate structure 25.

As shown in FIGS. 6B and 6C, the rear surface of the display region V of the display panel 28 is adhered to the front surface of the support substrate 58 by an adhesive layer 60 and the two left and right sides of the frame region F are folded back from the vicinity of the circumference of the display region V to the rear surface side of the support substrate 58. Preferably, the display panel 19 begins to be bent from the curved area m to the rear surface side of the support substrate 58. The bending starting point is not limited to the configuration in which the display panel is curved from the curved area m, the panel may be bent at a boundary between the display region V and the frame region F or may be bent within the display region V if a region used for the actual display is viewed on the front surface of the display panel 19 (the outer surface of the counter substrate 16). The display panel may be bent within the frame region F if the apparent frame region is smaller than that of the related art. In any of these cases, since the frame region F is folded back to the rear surface, it is possible to narrow the frame of the display panel 19.

By this configuration, as shown in FIG. 6A, the left and right planar lengths of the frame region F are set to a length k3 shorter than the length k2 of the display device 100 of Embodiment 1.

FIG. 7A is a plan view of the display panel 28 in a single item state, in which the two left and right sides of the frame region F extend. In other words, the flat plate state of the display panel before being set on the support substrate 58 is shown.

The display panel 19 is different from the display panel 18 of Embodiment 1 only in that the horizontal width thereof is increased. In detail, the lengths of the left and right sides of the frame region F are set to a length k5 longer than a length k1. In addition, the horizontal width of the curved area m is twice or more of the display panel 18 of Embodiment 1.

The planar size of the laminate structure 25 is greater than that of the display panel 19 by pasting portions (laminating portions). In detail, all four sides are increased by the length (width) u5 from the outer shape of the display panel 19. That is, pasting portions are provided on all the circumferences of the display panel 19 by the length (width) u5.

The flexible substrate 20 is formed so as to be lengthened in the (−) side of the Y axis by the pasting portion and the driving IC 21 is set so as to be exposed (spread out) from the laminate structure 25.

In addition, this display panel 28 may be used as the display panel of Embodiment 1. Even in this configuration, the same effects as Embodiment 1 can be obtained.

Regarding Material of Resin Film

The description returns to FIG. 6C.

Now, the material of the two resin films 25a and 25b configuring the laminate structure 25 will be described.

The resin films 25a and 25b laminated to cover the display panel 19 require functions such as an adhesion property with a glass substrate, bendability, transparency (light extraction property), a mold property (insulation and heat resistance) of the flexible substrate 20, or a moisture-resisting property for internally preventing permeation by moisture.

In order to satisfy such functions, as the material of the resin films 25a and 25b, resin based on polyethylene having a moisture resisting property (low absorption rate), an insulation property, bendability, transparency, and a low-temperature welding property is preferable. In order to enhance the adhesion property, a copolymer partially having a polar group is more preferable.

In the present embodiment, as a suitable example, an ethylene-vinyl acetate copolymer (EVA) which is one kind of polyethylene-based copolymer is employed as the material of the resin films 25a and 25b.

The material of the resin films is not limited to the EVA and a polyethylene-based copolymer having the same function may be used.

For example, any one of a polyethylene terephthalate (PET), an ethylene-methacrylic acid copolymer, ethylene-methacrylic acid alkoxy ethyl copolymer, an ethylene-methacrylic acid amino ethyl copolymer, an ethylene methacrylic acid hydroxyglycidyl copolymer, an ethylene-vinyl alcohol copolymer (EVOH), an ethylene-acrylic acid copolymer (EAA), an ethylene-methacrylic acid copolymer (EMAA), and an ethylene-acrylic acid alkyl copolymer is preferably used. Alternatively, a copolymer (for example, an ethylene-vinyl acetate-vinyl alcohol copolymer or the like is excellent in the adhesion property for both glass and CFRP) obtained by combining them or a mixture thereof may be used.

In order to enhance the heat-resisting property, a curing component such as an epoxy compound, an isocyanate compound, or an amine compound such as polyethyleneimine may be included as a cross-linking agent. In addition, among the ethylene copolymers, if a material having a carboxylic group which is not esterified, such as an ethylene-acrylic acid copolymer (EAA) or an ethylene-methacrylic acid (EMAA), is used, an iron wiring or the like of the flexible substrate 20 which is excellent in a low-temperature welding property and an adhesion property may be corroded. Thus, it is preferable that it is combined with a cross-linking component such as an epoxy-based curing agent to be cross-linked by heat such that acrylic acid does not remain.

Method of Laminating Display Panel

Figure 7B:
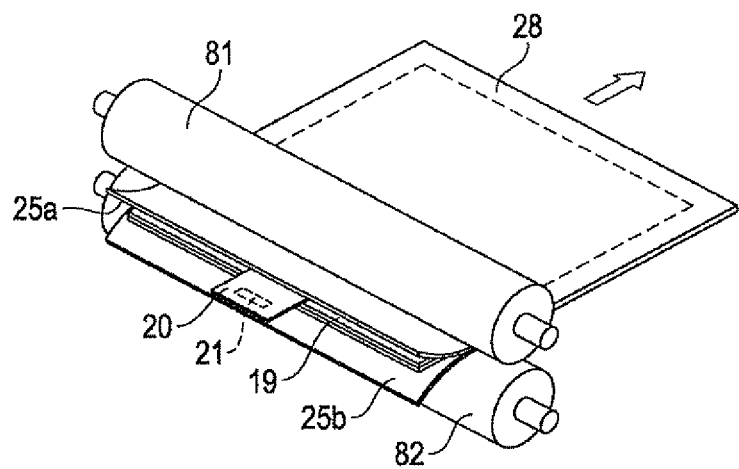
FIG. 7B is a diagram showing a manufacturing step of a laminate process.

FIG. 7B is a diagram showing a manufacturing step of a laminate process.

Now, a method of manufacturing the display panel 28 will be described in detail.

First, members are set in a laminate device in a superposed state (preparatory body). In detail, the display panel 19 and the resin film 25a are superposed on the resin film 25b in this order. Although this process is performed in a general environment as a suitable example, the process may be performed in the below-described depressurization environment.

In addition, the inner surfaces (the surfaces of the display panel 19 side) of the resin films 25a and 25b may be coated with a transparent adhesive in advance. As the adhesive, for example, an epoxy-based, urethane-based or nylon-based thermosetting adhesive or an SBR-based, chloroprene-based or nitrile rubber-based adhesive, an acrylic-based or synthetic rubber-based depressurization adhesive or the like may be used.

The preparatory body is set in the laminate device. In addition, in FIG. 7B, only pressurization rollers 81 and 82 of the laminate device are shown.

Subsequently, an environment in which the laminate device and the preparatory body are provided is depressurized so as to form a depressurization environment. In addition, the laminate device is provided in a chamber device for setting an internal environment to a desired atmospheric pressure environment. By this process, air (air bubbles) in the preparatory body is eliminated (defoamed).

Simultaneously, the pressurization rollers 81 and 82 are heated such that the roller surfaces formed of an elastomer having a heat conductive property are heated to a temperature of 80 to 120° C.

Subsequently, as denoted by arrow of FIG. 7B, the preparatory body is inserted between the pair of pressurization rollers 81 and 82 from one side of the preparatory body opposed to the flexible substrate 20 to be laminated. The resin films 25a and 25b are melted by the heat of the roller and are pressurized and adhered to each other, in a portion interposed between the pressurization rollers 81 and 82. The melted resin films function as an adhesive (filling agent) and are adhered to cover the display panel 19 and the flexible substrate 20. In other words, the resin films, of which the adhered surfaces are melted, integrally laminate the portions.

In order to perform laminate from one side to the other side of the preparatory body, although air bubble (air) is left in the members, the air bubble is extruded from the other side in laminate order. As shown in the drawing, the laminated display device 110 is extruded from the pressurization rollers 81 and 82 so as to complete the laminate.

In addition, the laminate device is not limited to a roll laminate method including the pair of pressurization rollers 81 and 82 and any device for laminating the preparatory body to the completed state of the display device 110 may be used. For example, a diaphragm type vacuum laminate device for setting the preparatory body on one plate-shaped heating plate (hot plate) and performing heating and pressurization in a state in which a modified rubber sheet is pressed onto the preparatory body by an atmospheric pressure difference may be used.

Operation of Laminate Structure

Figure 8A:
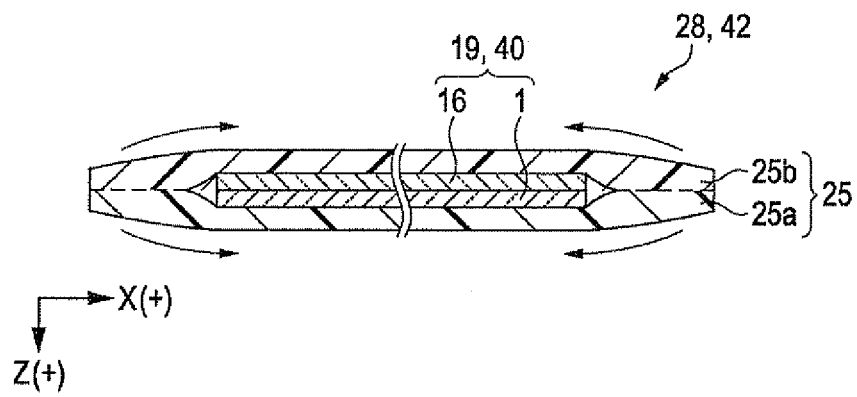
FIGS. 8A and 8B are diagrams explaining an action of a laminate structure.
Figure 8B:
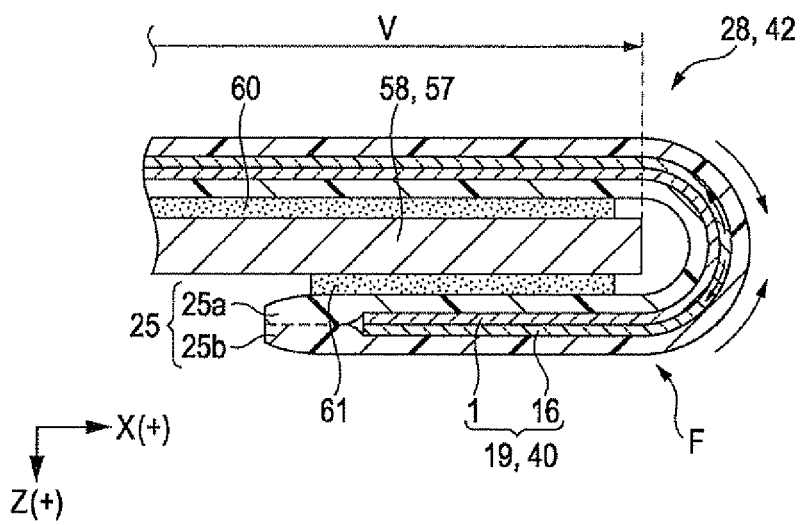

FIGS. 8A and 8B are diagrams explaining an action of a laminate structure. FIG. 8B corresponds to FIG. 6C.

Now, the action regarding bending resistance by the laminating of the display panel 19 by the laminate structure 25 will be described.

The laminate structure 25 has an action for improving bending resistance in addition to an action for surrounding the display panel 19 so as to prevent external permeation by moisture or to soften mechanical impact.

In detail, since the laminate structure 25 is heated at the time of laminate and, thereafter, is naturally cooled, under the room temperature after cooling, as denoted by arrow of FIG. 8A, shrinkage stress in which the laminate structure is always shrunk is generated.

After laminate, the shrinkage stress of the front and rear surfaces is offset in a state of being fixed by the pasting portion of the circumference of the laminate structure 25. In other words, since the shrinkage stress of the front and rear surfaces is in balance, the display panel 28 is maintained in a flat state.

According to the findings of the inventors' experimental results, it can be seen that this shrinkage stress has the same action as a compression stress layer formed on the front and rear surfaces of hardened glass. That is, when tension for destroying hardened glass (display panel) is applied, the compression stress layer (laminate structure) of the front surface eliminates the tension. Thus, strength performance which is twice or more that of the case where the layer is not formed can be realized.

This action is effectively applied, in particular, to the bent portion.

For example, as shown in FIG. 8B, in the case where the display panel 28 is bent, tensile stress is generated in the curved portion of the internal display panel 19 as denoted by the internal arrows. For example, the tensile stress acts in a direction in which a micro crack is enlarged if a micro crack is present in the end of the curved portion.

In contrast, in the curved portion of the laminate structure 25, shrinkage stress is applied as denoted by the external arrows. This shrinkage stress acts in a direction in which the excessive bending of the internal display panel 19 is suppressed. For example, if a micro crack is present in the end of the curved portion of the display panel 19, the shrinkage stress acts such that the micro crack is not enlarged.

Since the material or thickness of each portion of the display panel 28 is set such that the shrinkage stress is greater than the tensile stress, the display panel 28 laminated by the laminate structure 25 has bending resistance superior to that of the single item of the display panel 19. In other words, since the display panel 28 has excellent bending resistance, the display panel can be used for bending (bending-back) of 180 degrees as shown in FIG. 8B.

Dimension of Each Portion and Manufacturing Method

The description returns to FIG. 7A.

Now, an optimal dimension of each portion will be described.

First, the dimensional relationship of the display panel 19 in an initial state will be described. The thickness of the display panel 19 is equal to that of the description of Embodiment 1.

Both the lengths k5 of both left and right sides of the frame region F of the display panel 19 of a suitable example are set to about 8.0 mm. This is because the length of the curved portion is about twice that in the bending state of FIG. 1C and, after folding back, the pasting portion adhered to the rear surface of the support substrate 58 is necessary. In addition, the lengths k1 of the upper and lower sides of the frame region F are about 3.0 mm.

The description returns to FIG. 6C.

Next, the thickness of the resin films 25a and 25b configuring the laminate structure 25 and the total thickness of the display panel 19 will be described.

In the present embodiment, as a suitable example, an EVA film having a thickness of about 50 μm is used in the resin films 25a and 25b. According to the inventors' experimental results, it can be seen that a thickness of about 20 μm or more is necessary for satisfying coatability (filling property) of a step difference including a gap in the circumference of the display panel 19 and securing shrinkage stress.

In consideration of balance in such characteristics and the total thickness of the display device 110, the thickness is in a range of 20 to 100 μm. In consideration of the cost of the resin film or facilitation of laminate (workability), the thickness is in a range of 40 to 80 μm.

In addition, the total thickness of the display panel 19 formed by laminating the portions each having a thickness of the above-described suitable example is about 170 μm.

Subsequently, the dimension of each portion associated with the folded-back portion will be described.

In the thickness of the support substrate 58 of the suitable example is about 1.5 mm.

The adhesive layers 60 and 61 of the suitable example use the double-sided tape and both the thicknesses thereof are set to 0.2 mm. In addition, the thickness is not limited to this value and is in a range of 0.1 to 0.5 mm. Similarly to the description of Embodiment 1, an adhesive may be used.

The total thickness of the adhesive layers 60 and 61 and the support substrate 58 of the suitable example is about 1.9 mm.

Now, the manufacturing method for forming the display device 110 by setting the display panel 19 on the support substrate 58 will be described.

First, the adhesive layer 60 is adhered to the front surface of the support substrate 58. In addition, Embodiment 2 is equal to Embodiment 1 in that the invention is not limited to the adhering of the double-sided tape to the entire front surface and any configuration in which the display region V is substantially supported (fixed) in a flat state may be used.

Next, as shown in FIG. 6B, the rear surface side of the display region V of the display panel 28 is adhered to the front surface of the support substrate 58.

As shown in FIGS. 6B and 6C, the left and right sides of the frame region F are folded back on the (+) side of the Z axis and the folded-back portions are adhered to the rear surface of the support substrate 58 by the adhesion layer 61. In addition, the adhesion layer 61 is preferably adhered to the support substrate 58 in advance. At the time of being folded back, the folding line is not adhered and the folded-back portion is folded to be naturally curved according to the thickness of the support substrate 58.

Therefore, as shown in FIG. 6C, the frame region F is curved with substantially the center of the end surface of the support substrate 58 as center, and the folded-back portion is fixed to the rear surface of the support substrate 58.

At this time, in one right side of the frame region F of the display panel 19, the bending radius R of the inside of the device substrate 1 is about 1.0 mm. This value is greater than the allowable bending radius R described with reference to FIG. 4.

The lengths k3 of the left and right sides of the frame region F of the display device 110 (the display panel 28) of the completed state are about 1.1 mm, which is less than the length k2 (about 1.3 mm) of the same portion of Embodiment 1. In addition, when compared with the length u2 (about 1.5 mm) of the left and right sides of the frame region of the display device 100 of Embodiment 1, a difference thereof is more noticeable.

In addition, the total thickness of the display device 110 is about 2.3 mm, which is less than the total thickness (about 3.5 mm) of the display device 100 of Embodiment 1.

The dimensions of the suitable example are one suitable example derived from the experimentation results of the inventors or researches from physical data or the like, the dimensions are not limited thereto, and the dimensions may be set according to the size or use of the display panel without departing from the technical scope of the present embodiment.

In addition, the display panel 19 excluding the laminate structure may be used as the display panel of the present embodiment. Even in this configuration, it is possible to realize frame narrowing.

As described above, according to the display device 110 of the present embodiment, the following effects can be obtained in addition to the effects of Embodiment 1.

According to the display device 110, the left and right sides of the frame region F are folded back to the rear surface in a state in which the rear surface of the display region V of the display panel 28 is fixed using the support substrate 58 as a core and the folded-back portion is adhered to the rear surface of the support substrate 58. Thus, it is possible to realize frame narrowing and thinness.

Accordingly, it is possible to provide the display device 110 capable of realizing frame narrowing. In other words, it is possible to provide the display device 110 capable of realizing frame narrowing utilizing the flexibility.

In addition, since the display panel 28 employs the configuration in which the display panel 19 is laminated by the laminate structure 25, it is possible to enhance an external permeation by moisture preventing property. Since mechanical impact is softened, it is possible to improve a treatment property. In addition, since bending resistance can be improved, it is difficult to generate breaking.

Since the length k5 of the left and right sides of the frame region F of the display panel 19 is greater than the length k1 of Embodiment 1, the barrier layer lengthens so as to improve reliability.

Since the wiring portion is selectively formed in the curved area m of the frame region F and the circuit portion n is formed in a region excluding the area, it is possible to prevent the circuit portion n from being damaged by bending.

Accordingly, it is possible to provide the display device 110 capable of realizing both reliability securing and frame narrowing.

Since the support substrate 58 is formed using an aluminum plate with an excellent thermal conductivity coefficient, heat emitted from the display panel 19 can be absorbed and externally radiated in an efficient fashion.

Accordingly, it is possible to provide the display device 110 capable of realizing frame narrowing and an excellent heat radiation property.

In addition, since the support substrate 58 is a simple flat plate, the support substrate can be efficiently manufactured by press working. Thus, it is possible to suppress the cost of parts.

In addition, the total thickness of the adhesive layers 60 and 61 and the support substrate 58 of the suitable example is about 1.9 mm, and the half (about 0.95 mm) of the total thickness and the bending radius R of the inside of the device substrate 1 are substantially equal to about 1.0 mm.

Accordingly, it is possible to prevent the device substrate 1 from being bent while exceeding the allowable bending radius R by the total thickness. In other words, by setting the total thickness of the adhesive layers 60 and 61 and the support substrate to suit the allowable bending radius R of the device substrate 1, it is possible to simply realize frame narrowing in the range of the allowable bending radius R of the device substrate 1.

In addition, the total thickness of the display device 110 of the suitable example is about 2.3 mm, which is less than the total thickness (about 3.5 mm) of the display device 100 of Embodiment 1.

Accordingly, it is possible to provide the display device 110 capable of realizing both thinness and frame narrowing.

In general, although the connection portion between the extension region of the display panel 19 and the flexible substrate 20 is reinforced according to a molding agent such as silicon resin (adhesive) covering the connection portion, the connection portion may be easily peeled.

In contrast, according to the display panel 28, since the reinforcement configuration is obtained by the laminate using the resin films 25a and 25b, manufacturing efficiency is good. Since the connection portion and the display panel 19 are adhered (filled) by the same resin, it is possible to secure sufficient practical strength (toughness) without spoiling bendability.

In addition, since the polyethylene-based adhesive layer used in the resin films 25a and 25b are excellent in an insulation property, a moisture-proof property and a heat-resisting property, it is possible to secure sufficient electrical reliability.

Embodiment 3

Outline of Display Device

Figure 9A:
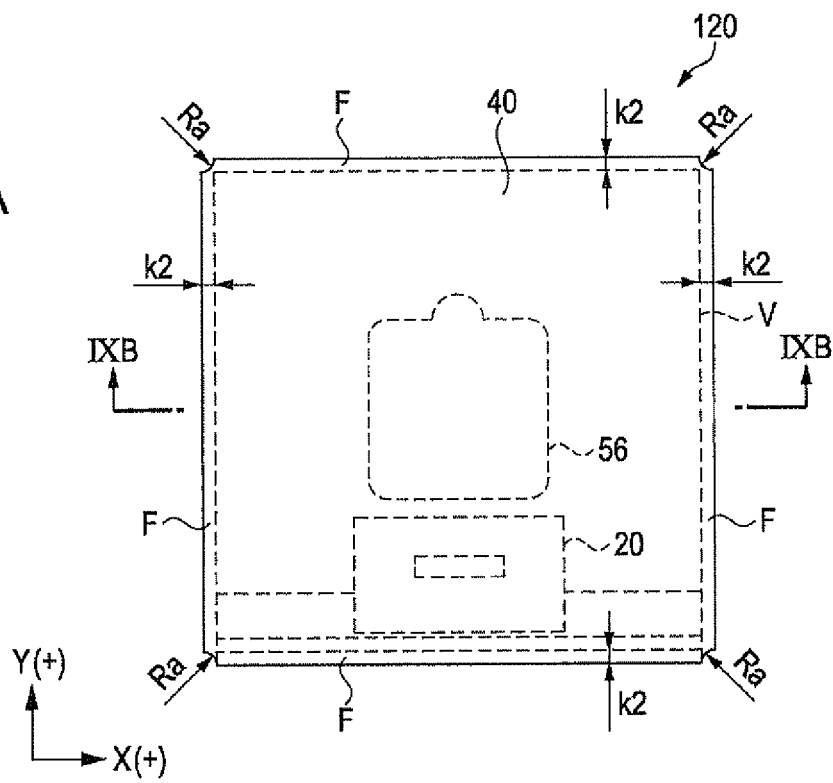
FIG. 9A is a plan view showing a display device of Embodiment 3.
Figure 9B:
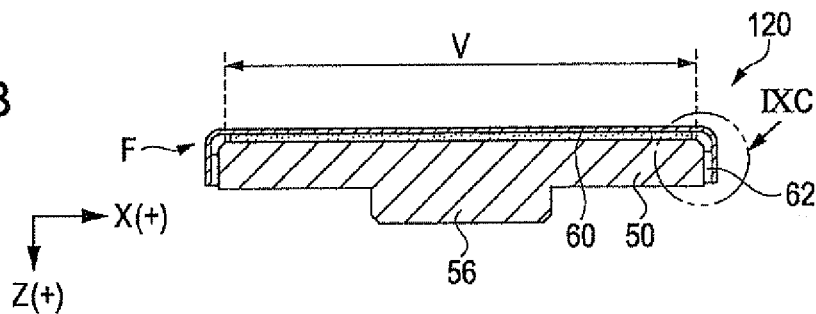
FIG. 9B is a side cross-sectional view taken along line IXB-IXB of FIG. 9A.
Figure 9C:
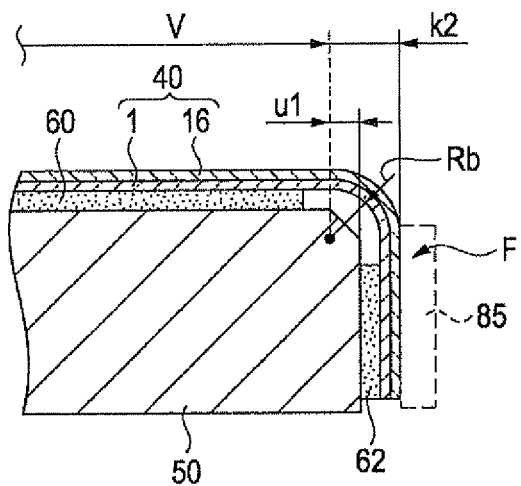
FIG. 9C is an enlarged view of an IXC portion of FIG. 9B.

FIG. 9A is a plan view showing a display device of Embodiment 3, FIG. 9B is a side cross-sectional view taken along line IXB-IXB of FIG. 9A, and FIG. 9C is an enlarged view of an IXC portion of FIG. 9B.

Hereinafter, the outline of the display device 120 as an electro-optical device according to Embodiment 3 will be described. In addition, the same components as Embodiments 1 and 2 are denoted by the same reference numerals and the description thereof will be omitted.

The display device 120 of the present embodiment is a display device suitable for a tiling use, which is capable of realizing frame narrowing throughout all circumferences by using a structure in which the frame region of all the four sides of the display region V are bent.

The display device 120 is an organic EL display device and includes a support frame 50 and a display panel 40 set on the support frame.

The display panel 40 is an organic EL panel which is equal to the display panel 18 of Embodiment 1 excluding the planar shape at the time of expansion. In addition, the planar shape at the time of expansion will be described later.

The display device V of the display panel 40 has substantially a square shape as a suitable example, and, when facing FIG. 9A, a vertical direction of the panel is set to a Y-axis direction, a horizontal direction is set to an X-axis direction, and the thickness direction of the display panel 40 is set to a Z-axis direction. The shape of the display panel is not limited to the square shape, and a shape in which the display region V can be adjacently aligned without a gap, such as a rectangular shape, may be used.

Here, as shown in FIG. 9A, the outer shape of the display device 120 is substantially equal to the square shape of the display region V in plan view. In detail, although the frame region F extends from each side of the display region V by the length k2, the length of the extension is small. Thus, it is observed that the outer shape of the display device is substantially equal to the square shape of the display region V.

This is realized by bending the frame region F of each side of the display panel 40 to the support frame 50 side (the (+) side of the Z axis) as shown in FIGS. 9B and 9C. In detail, each frame region F is bent from the circumference of the display region V to the (+) side of the Z axis in every side and is fixed to the side surface of the support frame 50 by an adhesive layer 62. In addition, the frame region F of the lower side is bent to the rear surface of the support frame 50 after being bent to the side surface of the support frame 50.

By bending each side of the frame region F substantially at a right-angle, since it is possible to realize frame narrowing at the all circumferences of the display panel 40, the display device 120 is suitable for the tiling use.

Detailed Configuration of Display Panel

Figure 10:
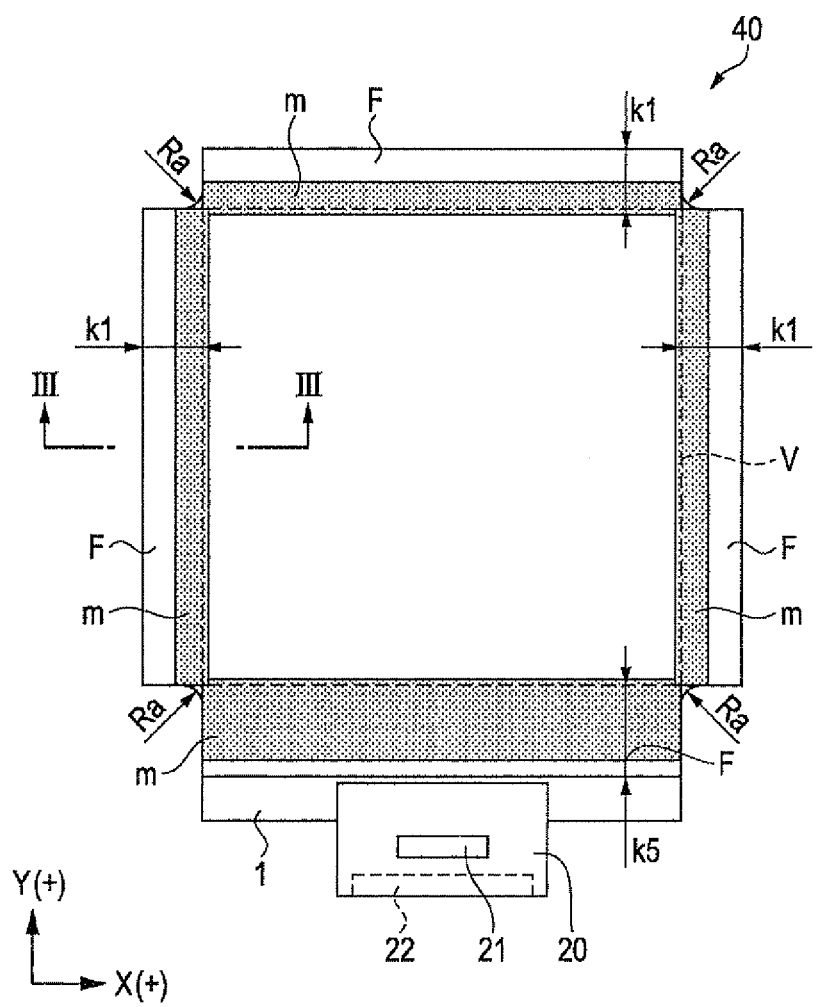
FIG. 10 is a plan view of a display panel.

FIG. 10 is a plan view of a display panel and corresponds to FIG. 9A.

Subsequently, the detailed configuration of the display panel 40 will be described with reference to FIGS. 9 and 10.

FIG. 10 is a plan view of the display panel 40 in a single item state (at the time of expansion), in which the frame regions F of all sides (four sides) extend. In other words, the shape of the flat display panel 40 before being set on the support frame 50 is shown.

The display panel 40 is obtained by adhering a device substrate 1 and a counter substrate, both of which are formed of glass substrates, and an extended frame region F extending from each side of the display region V to the outside of the display region V is formed in every side. In other words, four rectangular frame regions F having each side of the display region V as one side are formed on the peripheries of the display region V. Four corners of the display region V are notched in an L shape so as to partition the frame regions F, and angular radii Ra each having a predetermined curvature radius are formed in the corners of the notched portions. The angular radius Ra is set to, for example, about 1.0 mm.

In addition, in the present embodiment, the region which is located on the outside of the display region V and in which the device substrate 1 and the counter substrate are superposed is defined as the frame region F.

As shown in FIG. 10, in an initial state, the lengths of the frame regions F of the upper side and the left and right sides, that is, three sides, are equally set to a dimension k1. When the two left and right sides among the four sides are bent and the display panel 40 is set on the support frame 50, as shown in FIG. 9A, both the lengths of the two left and right sides in plan view is a dimension k2. The length of the upper side is equally set to the length k2.

The length of the frame region F of the lower side in the initial state is set to a length k5 which is greater than the length k1. This is because the frame region F of the lower side is folded back to the rear surface of the support frame 50 and is set large, as described above. The frame region is folded back to the rear surface of the support frame 50 and the length thereof in plan view becomes the length k2 similar to the other sides, as shown in FIG. 9A.

In addition, in FIG. 10, portions denoted by dot hatching along the sides of the display panel 40 are portions curved by bending when the display panel is set on the support frame 50 and are defined as curved areas m.

An extension region in which the device substrate 1 extends from the counter substrate is formed on the end of the lower direction (the (−) side of the Y axis) of the frame region F of the lower side.

The flexible substrate 20 is connected to the extension region. In addition, a driving Integrated Circuit (IC) 21 is mounted on the flexible substrate 20 and a plurality of terminals 22 for connection with a dedicated controller or an external device (both of which are not shown) is formed on an end thereof.

The side cross-sectional view of the display panel 40 taken along line III-III of FIG. 10 is equal to FIG. 3 and the configuration thereof is equal to that of the description of Embodiment 1.

In FIG. 10, the curved area m extends to the inside of the display region V because the pixel circuit such as the driving transistor 3 is not arranged in the area even in the inner circumference portion of the display area V.

In addition, the configuration of the display panel 40 is not limited to a top emission type and any configuration in which an electro-optical layer is interposed between two glass substrates may be used. For example, a bottom emission type organic EL display device for emitting light from the organic EL layer 8 to the device substrate 1 side may be used. In addition, an inorganic EL display device including an inorganic EL as a light source may be used.

Detailed Configuration of Support Frame

The description returns to FIG. 9.

Now, the detailed configuration of the support frame 50 will be described with reference to FIG. 9.

The support frame 50 is a plate-shaped member which is formed with the same planar size, that is, the same area, as the display region V, and the front surface supporting the display panel 40 is a flat surface. The side surface to which the bent frame region F is adhered is vertically formed from the front surface. The corner from the front surface to the side surface is chamfered.

A fitting protrusion 56 for deciding the planar position at the time of tiling is formed on the rear surface opposed to the front surface.

The protrusion 56 is a square protrusion formed on substantially the center of the rear surface in plan view and a semi-circular-shaped portion is formed on the upper side thereof. This semi-circular-shaped portion decides the all directions of the display device 120 (display panel 40).

The support frame 50 requires strength for reinforcing the sheet-shaped display panel 40 and a function such as a heat radiation property for absorbing heat emitted from the display panel 40 and externally delivering (radiating) the heat.

In the present embodiment, as a suitable example, a frame obtained by cutting an aluminum plate is used as the support frame 50. The support frame is not limited thereto, a material having the above-described function may be used, and, similar to the description of Embodiment 1, metal such as stainless steel or invar or resin may be used.

Regarding Dimension of Each Portion and Manufacturing Method

The thickness and the manufacturing method of the display panel 40 of the suitable example are equal to that of the description of Embodiment 1 (FIGS. 3 and 4).

As a suitable example, each of the thicknesses of the device substrate 1 and the counter substrate 16 is set to about 30 μm. The total thickness of the display panel 40 is set to about 70 μm as a suitable example.

In the manufacturing method, in order to prevent micro cracks, in particular, a laser scribing method using laser light is preferably used in the cutout of the sides adjacent to the angular radii Ra of the four corners of FIG. 10, that is, the sides including the curved areas m. After cutout, at least the ends of the curved areas m need to be melted in a solution such as hydrofluoric acid so as to eliminate micro cracks. In order to protect the end surface after cutout, the circumference of the display panel 40 may be coated with resin. For example, the circumference is coated by a dipping method with epoxy resin, acrylic resin, urethane resin, silicon resin or the like.

As shown in FIG. 9C, in the display panel 40 of the suitable example, the right side of the frame region of the display panel 40 is bent the support frame 50 side in a state in which the rounding radius Rb of the inside of the device substrate 1 is about 1.0 mm.

Although the bending starting point is the curved area m in the suitable example, the bending starting point is not limited to the configuration in which the display panel is curved from the curved area m, the panel may be bent at a boundary between the display region V and the frame region F or may be bent within the display region V if a region used for the actual display is viewed on the front surface of the display panel 40 (the outer surface of the counter substrate 16). The display panel may be bent within the frame region F if the apparent frame region is smaller than that of the related art. In any of these cases, since the frame region F is folded back to the rear surface, it is possible to narrow the frame of the display panel 40.

The description returns to FIG. 10.

Subsequently, the planar dimensional relationship of the initial state of the display panel 40 will be described.

All the lengths k1 of the frame regions F of the upper side and the left and right sides of the display panel 40 of a suitable example, that is, the lengths of the three sides, are set to about 3.0 mm.

The length k5 of the frame region F of the lower side of the display panel 40 of a suitable example is set to about 6.0 mm. The length is not limited to this value and is appropriately set to a length of 2.0 mm or more according requirements (reliability).

Subsequently, the manufacturing method for forming the display device 120 by setting the display panel 40 on the support frame 50 and the dimensions of the portions associated therewith will be described.

First, the adhesive layer 60 formed of a double-sided tape is adhered to the front surface of the support frame 50. The thickness of the double-sided tape of a suitable example is set to 0.3 mm. The thickness of the double-sided tape is not limited to this value and is in a range of 0.1 to 0.5 mm.

The invention is not limited to the adhering of the double-sided tape to the entire front surface of the support frame 50 and any configuration in which the display region V is substantially supported (fixed) in a flat state may be used. For example, band-shaped double-sided tapes extending in the X-axis direction may be located on both ends and the central portion of the display region V in the Y-axis direction such that three tapes are arranged in a stripe shape. According to this configuration, it is possible to suppress generation of air bubbles when the display panel 40 is adhered.

In order to enhance the heat radiation property, a double-sided tape including the above-described heat conductive filler may be used. The adhesive layer is not limited to the double-sided tape and an adhesive having the same adhesive property may be used.

Subsequently, as shown in FIG. 9A, the rear surface of the display region V of the display panel 40 is adhered to the front surface of the support frame 50. In addition, the planar size of the support frame 50 of a suitable example is greater than that of the display region V and, in detail, is greater than that of the display region V by a length u1. In other words, the vertical and horizontal lengths of the support frame are set to be greater than that of the display region by "2×length u1". In addition, the length u1 of a suitable example is set to about 0.5 mm.

This is because the frame region F is enabled to be substantially orthogonal to the front surface of the support frame 50 in consideration of the thickness or the like of the adhesive layer 60 or the display panel 40 when the frame region F is adhered to the side surface of the support frame 50.

In addition, the thickness of the support frame 50 of a suitable example is set to about 3.5 mm and the corners from the front surface to the side surface are chamfered, for example, in a range of C0.5 to 1.0 mm. In addition, the height of the protrusion 56 from the rear surface is set to about 5.0 mm.

In addition, as shown in FIGS. 9B and 9C, the frame regions F of the left and right sides are bent to the (+) side of the Z axis and the adhesive layer 62 formed of a double-sided tape is adhered to the side surface of the support frame 50. The thickness of the double-sided tape of a suitable example is set to 0.5 mm. The thickness of the double-sided tape is not limited to this value and is in a range of 0.1 to 1.0 mm. Similarly, the frame region F of the upper side is bent and the adhesive layer 62 is adhered to the side surface of the support frame 50.

After the frame region F of the lower side is bent to the (+) side of the Z axis and the adhesive layer 62 is adhered to the side surface of the support frame 50, the frame region is further bent to the rear surface of the support frame 50 and the end of the frame region is adhered to the rear surface by the double-sided tape.

In addition, as denoted by a dotted line of FIG. 9C, the adhered frame region F may be externally pressed and adhered by a tape member 85. The tape member 85 may be a tape formed of resin or a member (bezel) formed by forming a steel belt in a ring state. If the tape member 85 is provided, the frame region F can be fixed to the side surface of the support frame 50 with more certainty. The tape member 85 functions as an impact buffer member when the side surface is contacted at the time of treatment or tiling.

By the above-described processes, as shown in FIGS. 9B and 9C, the frame region F of each side is bent substantially at a right-angle and is fixed to the side surface of the support frame 50.

First, the planar length k2 of the frame region F of a suitable example is about 1.1 mm.

That is, the planar size of the display device 120 is greater than that of the display region V by the frame region F, but the width (length k2) of the frame region F of a suitable example is suppressed to about 1.1 mm across the entire circumference thereof.

The total thickness (excluding the protrusion 56) of the support frame 50 of a suitable example is about 3.9 mm.

The dimensions of the suitable example are one suitable example derived from the experimentation results of the inventors or researches from physical data or the like, the dimensions are not limited thereto, and the dimensions may be set according to the size or use of the display panel without departing from the technical scope of the present embodiment.

Tiling Mode

Figure 11:
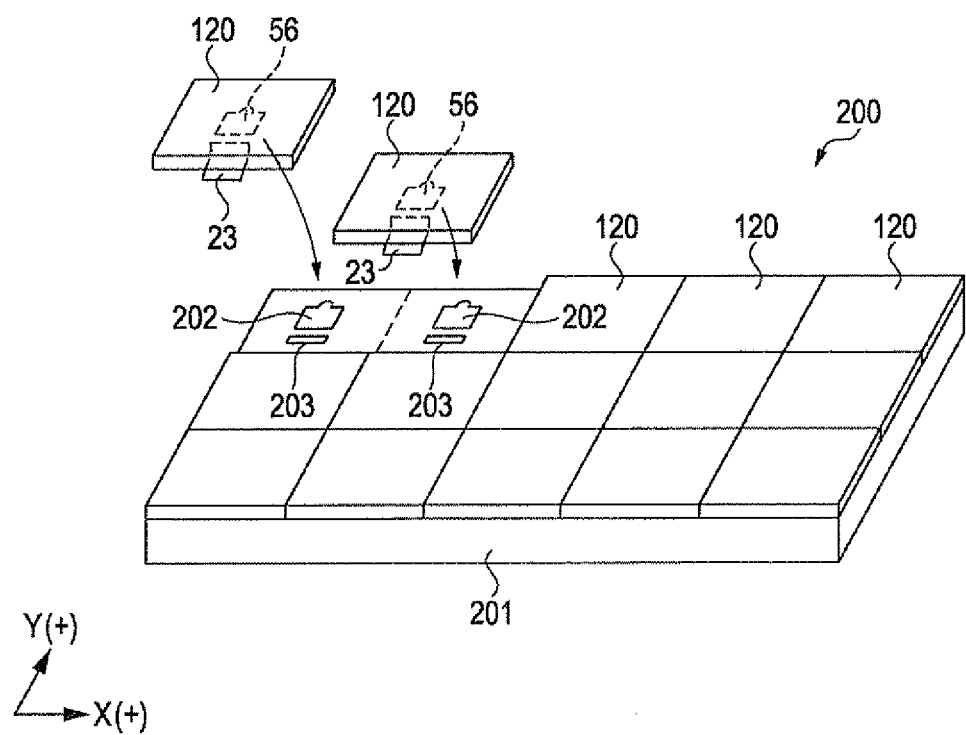
FIG. 11 is a perspective view showing a first multi-display device as an electronic apparatus.

FIG. 11 is a perspective view showing a first multi-display device including the display device of the present embodiment mounted therein.

Now, one mode of the case where tiling is performed using a plurality of display devices 120 will be described.

The multi-display device 200 as an electronic apparatus includes a configuration in which a horizontally-long large screen having an aspect ratio of 5:3 is formed by tiling the plurality of display devices 120.

The multi-display device 200 as an electronic apparatus includes a seat portion 201, the plurality of display devices 120 and the like.

The seat portion 201 is partitioned in a 3×5 matrix, and, in each partitioned region, as shown on the left upper side of FIG. 11, a fitting hole 202 into which the protrusion 56 of the display device 120 is fitted and a storage hole 203 for storing a connection substrate 23 are formed.

The fitting hole 202 has a planar shape greater than the planar shape of the protrusion 56. The semi-circular shape of each fitting hole 202 is aligned in the upper direction (the (+) direction of the Y axis).

In addition, the connection substrate 23 formed of a flexible printed substrate is connected to a terminal 22 (FIG. 10) of the flexible substrate 20 of each display device 120.

The storage hole 203 stores the connection substrate in a state in which the terminal portion of the connection substrate 23 is inserted into an internal socket. In addition, a wiring connected to the socket of each partitioned region or a controller in which wirings are aggregated (all of which are not shown) is placed on the rear surface of the seat portion 201 such that each display device 120 is displayed and driven by the controller.

By setting 15 display devices 120 in all the partitioned regions, a horizontally-long large screen having an aspect ratio of 5:3 is formed. In a suitable example, a gap between the display region V and the display region V of two neighboring display devices 120 is set to about 3.0 mm in both the vertical and horizontal directions, in consideration of a margin such as an attachment error.

As described above, according to the display device 120 according to the present embodiment, the following effects can be obtained.

According to the display device 120, the frame region F of each side of the display panel 40 is bent from the circumference of the display region V to the support frame 50 side and is fixed to the side surface of the support frame 50.

That is, since each frame region F is bent to the support frame 50 side, the planar length k2 of the frame region is reduced.

Accordingly, it is possible to provide the display device 120 capable of realizing frame narrowing.

In addition, since each of the thicknesses of the two glass substrates of the suitable example is about 30 μm, the allowable bending radius R of the display panel 40 is about 0.8 mm, but, in the display device 120, the bending radius Rb is set to about 1.0 mm which is greater than the allowable bending radius R in consideration of durability. Accordingly, it is possible to secure durability while realizing frame narrowing.

In addition, since the frame region F is bent, the length of the frame region F can be set to a length necessary to secure reliability.

Accordingly, it is possible to provide the display device 120 capable of realizing both reliability securing and frame narrowing.

Since the display panel has flexibility capable of being bent substantially at a right-angle, it is possible to realize frame narrowing which is potentially required as a market demand.

Accordingly, it is possible to provide the display device 120 capable of realizing frame narrowing utilizing the flexibility.

In addition, it is possible to realize a seamless display at the time of tiling by realizing frame narrowing. Accordingly, it is possible to provide the display device 120 suitable for a tiling type display device capable of suppressing a joint so as to obtain sufficient display quality.

In particular, according to the multi-display device 200, in the suitable example, the gap between the display region V and the display region V of two neighboring display devices 120 can be set to about 3.0 mm in both the vertical and horizontal directions.

In the case where the large screen is observed from appropriate visual distance, since it is difficult to substantially view the gap of about 3.0 mm, it is possible to realize a seamless display.

Since the wiring portion is selectively formed in the curved area m of the frame region F and the circuit portion n is formed in a region excluding the area, it is possible to prevent the circuit portion n from being damaged by bending.

Accordingly, it is possible to provide the display device 120 with high reliability.

Since the support frame 50 is formed using aluminum with a thermal conductivity coefficient higher than that of resin or glass, heat emitted from the display panel 40 can be absorbed and externally radiated in an efficient fashion. Accordingly, it is possible to provide the display device 120 capable of realizing frame narrowing and an excellent heat radiation property.

Embodiment 4

Figure 12A:
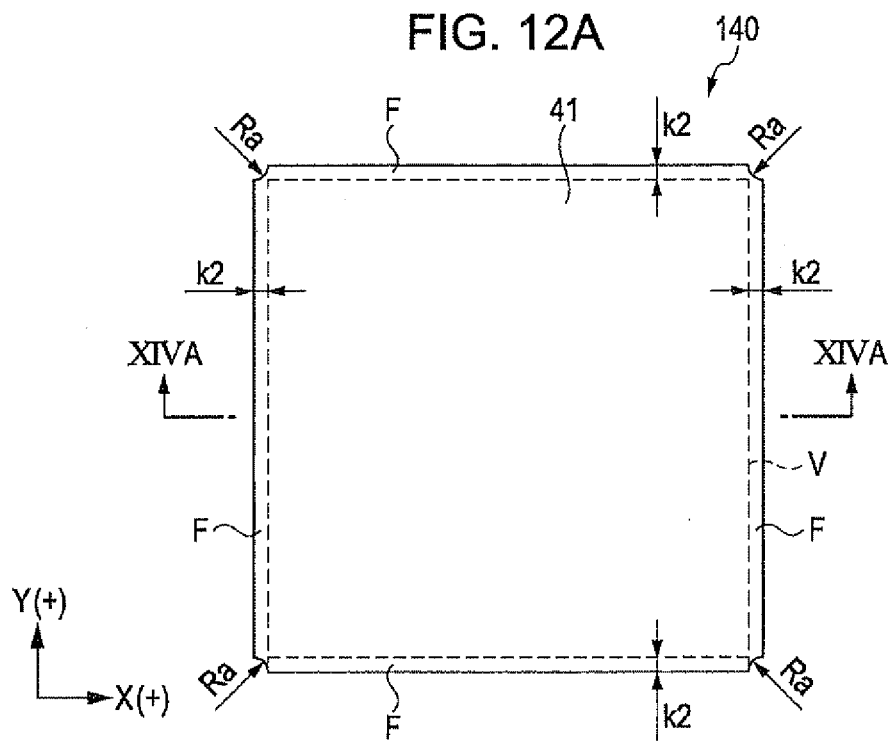
FIG. 12A is a plan view of a display device of Embodiment 4 and FIG. 12B is a back view.
Figure 12B:
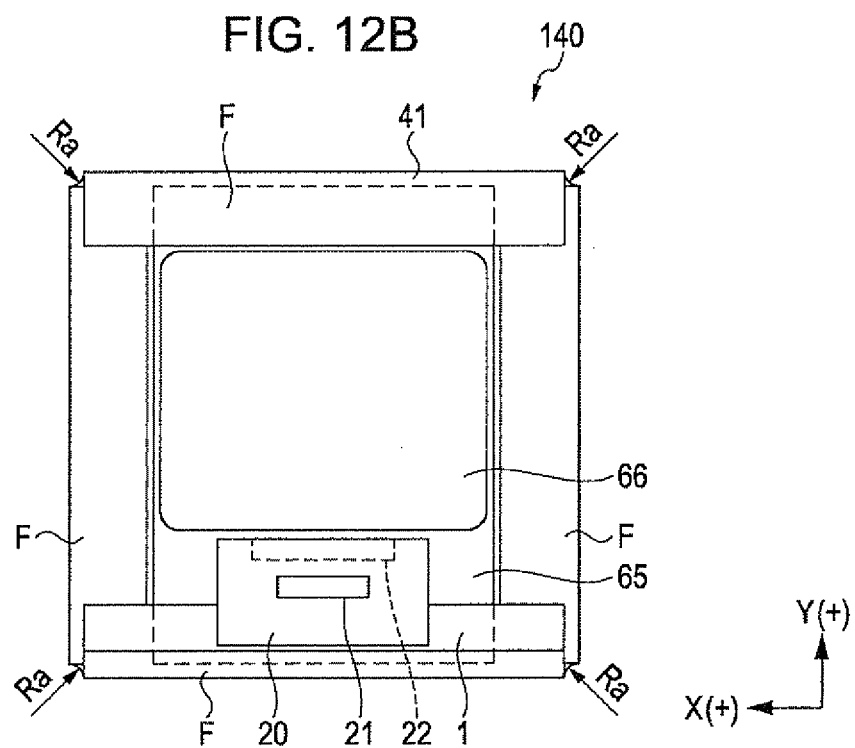
Figure 13:
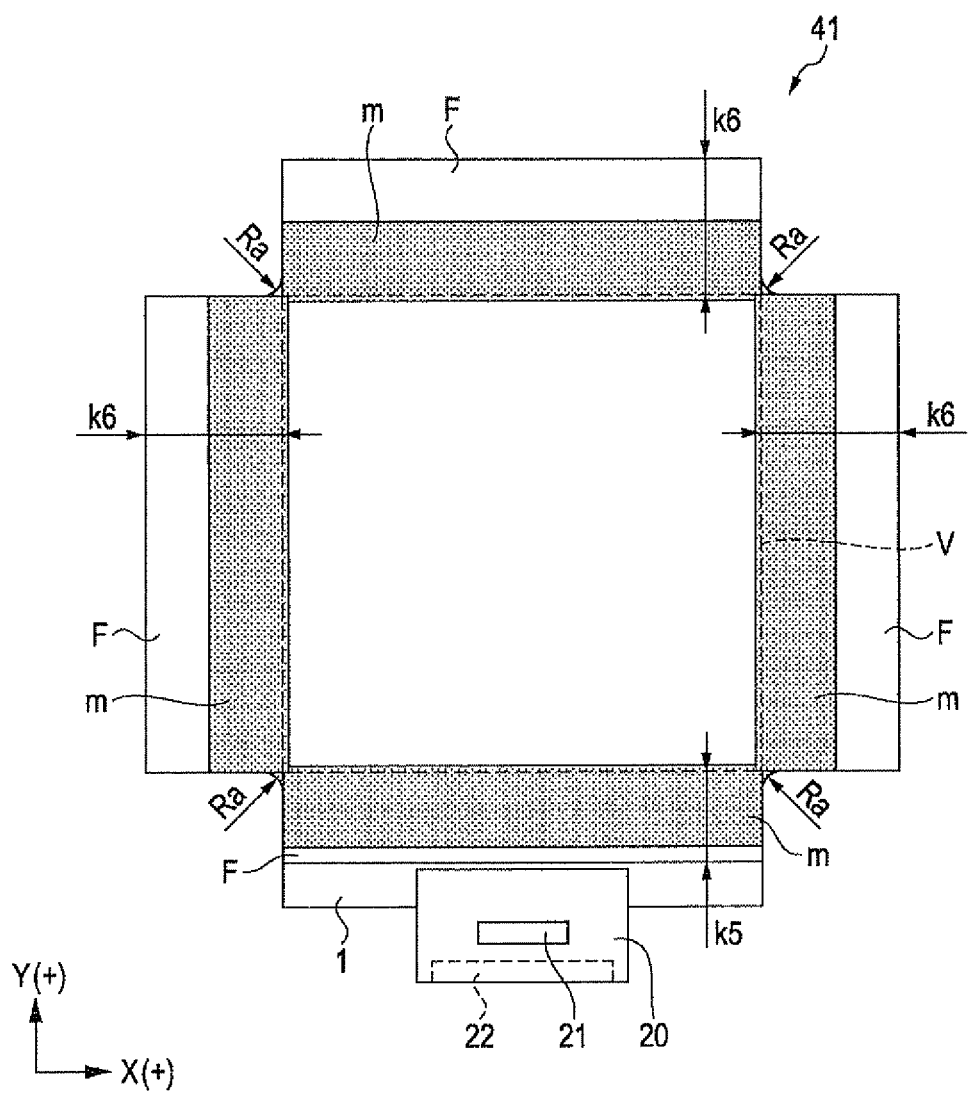
FIG. 13 is a plan view of a display panel.
Figure 14A:
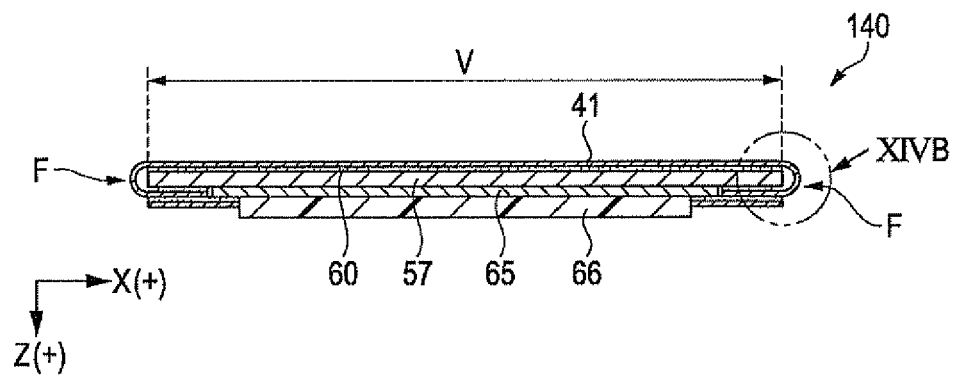
FIG. 14A is a side cross-sectional view taken along line XIVA-XIVA of FIG. 12A
Figure 14B:
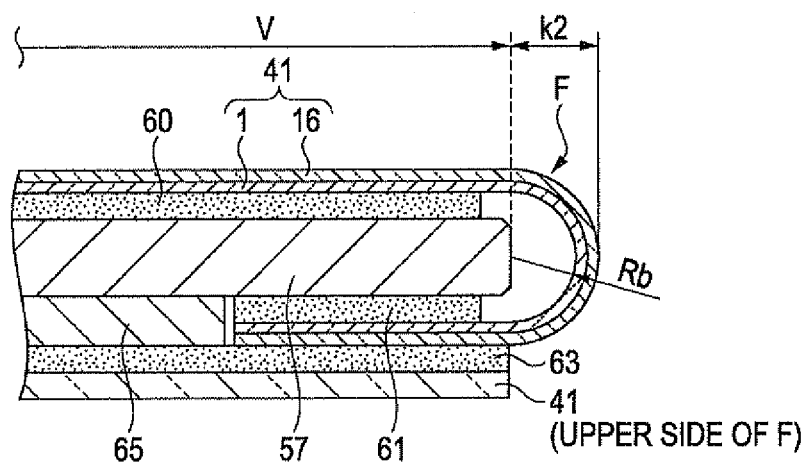
FIG. 14B is an enlarged view of a XIVB portion of FIG. 14A.

FIG. 12A is a plan view (front view) of a display device of Embodiment 4, which corresponds to FIG. 9A. FIG. 12B is a back view of the display device. FIG. 13 is a plan view of the display panel, which corresponds to FIG. 10. FIG. 14A is a side cross-sectional view taken along line XIVA-XIVA of FIG. 12A, which corresponds to FIG. 9B. FIG. 14B is an enlarged view of a XIVB portion of FIG. 14A, which corresponds to FIG. 9C.

Hereinafter, the display device 140 according to Embodiment 4 of the invention will be described. In addition, the same components as Embodiments 1 to 3 are denoted by the same reference numerals and the description thereof will be omitted.

The display device 140 of the present embodiment is a display device which employs a structure in which the frame region F of each side is folded back using a display panel 41 obtained by lengthening the frame regions F of the upper side and the left and right sides of the display panel 40 of Embodiment 3.

The display device 140 includes a support frame 57 (FIG. 14), the display panel 41, a spacer 65, a magnet sheet 66, and the like.

The support frame 57 is a metal flat plate of which the planar size is substantially equal to that of the display region V of the display panel 41. In the present embodiment, as a suitable example, an aluminum plate is used. The circumferences of the front and rear surfaces are chamfered.

The material of the support frame is not limited to aluminum and various metals described in Embodiment 1 may be used. Various resins described in Embodiment 1 may be used or a resin plate subjected to various surface treatments such as plating may be used.

FIG. 13 shows the planar shape of the display panel 41 in a single item state before being set on the support frame 57.

The display panel 41 is different from that the display panel 40 of Embodiment 3 in that the frame regions F of the upper side and the left and right sides lengthen. In detail, the lengths of the frame regions F of the upper side and the left and right sides are set to a length k6 which is greater than the length k1. The width of the curved area m is twice or more of that of the display panel 40 of Embodiment 3. In addition, the length of the frame region F of the lower side is the same length k5 as the display panel 40 of Embodiment 3.

The lengths k6 of the frame regions F of the upper side and the left and right sides are slightly greater than the length k5 of the lower side. This is because the pasting portion to the rear surface of the support frame 57 is formed by the length corresponding to the extension region of the lower side.

The spacer 65 is a sheet member formed of a resin film.

The magnet sheet 66 is a flexible magnetic sheet member formed by mixing magnetic power to a binder resin such as rubber or elastomer.

Regarding Manufacturing Method and Dimension of Each Portion

In Embodiment 4, the frame region F of each side of the display panel 41 is folded back to the rear surface of the support frame 57 so as to realize frame narrowing.

In detail, in a state in which the rear surface of the display region V of the display panel 41 is fixed to the front surface of the support frame 57, as shown in FIG. 12B, the frame regions F of the left and right sides are folded back to the rear surface of the support frame 57 and the spacer 65 for complementing the height between the folded-back frame regions F of the left and right side may be adhered. The frame regions F of the upper and lower sides are folded back and adhered on the folded-back frame regions F of the left and right sides and the spacer 65.

In addition, the magnet sheet 66 having substantially a square shape may be adhered onto the exposed spacer 65.

Subsequently, the detailed dimension of each portion will be described.

First, the thickness relationship of the display panel 41 is equal to that of the display panel 40 of Embodiment 3.

In addition, the length k6 of the frame regions F of the upper side and the left and right sides of a suitable example is about 8.0 mm. In addition, the length is not limited to this dimension and any length capable of securing the pasting portion for maintaining the folded-back state may be used.

The planar size of the support frame 57 of a suitable example is set to be equal to that of the display region V of the display panel 41 and the thickness thereof is set to about 1.6 mm. In addition, the chamfering of the circumferences is set to about C0.2 mm.

FIG. 14B is a side cross-sectional view of a portion in which the frame region F of the right side is folded back.

All the adhesive layers 60, 61 and 63 of a suitable example are formed of double-sided tapes and all the thicknesses thereof are set to 0.2 mm. On the lowermost layer of FIG. 14E, the end of the folded-back frame region F of the upper side is observed. In addition, the thickness is not limited to this value and is in a range of 0.1 to 0.5 mm. Similarly to the description of Embodiment 3, an adhesive may be used.

In addition, the total thickness of the adhesive layers 60 and 61 and the support frame 57 of a suitable example is about 2.0 mm.

In addition, the thickness of the spacer 65 of a suitable example is about 0.27 mm.

By such a combination, as shown in FIG. 14B, the frame region F is curved with substantially the center of the end surface of the support substrate 57 as center, and the folded-back portion is fixed to the rear surface of the support substrate 57. At this time, in the frame region F of the right side of the display panel 41, the bending radius Rb of the inside of the device substrate 1 is about 1.0 mm. This value is greater than the allowable bending radius R described with reference to FIG. 4. Although the bending starting point is the curved area m in the suitable example, the bending starting point is not limited to the configuration in which the display panel is curved from the curved area m, the panel may be bent at a boundary between the display region V and the frame region F or may be bent within the display region V if a region used for the actual display is viewed on the front surface of the display panel 41 (the outer surface of the counter substrate 16). The display panel may be bent within the frame region F if the apparent frame region is smaller than that of the related art. In any of these cases, since the frame region F is folded back to the rear surface, it is possible to narrow the frame of the display panel 41.

The length k2 of the frame region F of each side of the display device 140 (display panel 41) in the completed state is about 1.1 mm similarly to Embodiment 3.

In addition, the total thickness (excluding the magnet sheet 66) of the display device 140 is about 2.4 mm, and is less than the total thickness (excluding the protrusion 56, about 3.9 mm) of the display device 120 of Embodiment 3.

The dimensions of the suitable example are one suitable example derived from the inventors' experimental results or researches from physical data or the like, the dimensions are not limited thereto, and the dimensions may be set according to the size or use of the display panel without departing from the technical scope of the present embodiment.

As described above, according to the display device 140 of the present embodiment, the following effects can be obtained in addition to the effects of Embodiment 3.

According to the display device 140, the frame region F of each side is folded back to the rear surface of the support frame 57 in a state in which the rear surface of the display region V of the display panel 41 is fixed using the support frame 57 as a core and the folded-back portion is fixed, it is possible to realize frame narrowing and thinness.

Accordingly, it is possible to provide the display device 140 capable of realizing frame narrowing. In other words, it is possible to provide the display device 140 capable of realizing frame narrowing utilizing the flexibility.

Since the length k6 of the frame region F of the display panel 41 is greater than the length k1 of Embodiment 3, the barrier layer lengthens and thus reliability can be improved.

Since the wiring portion is selectively formed in the curved area m of the frame region F and the circuit portion n is formed in a region excluding the area, it is possible to prevent the circuit portion n from being damaged by bending.

Accordingly, it is possible to provide the display device 140 capable of realizing both reliability securing and frame narrowing.

Since the support frame 57 is formed using an aluminum plate with an excellent thermal conductivity coefficient, heat emitted from the display panel 41 at the time of the display can be absorbed and externally radiated in an efficient fashion.

Accordingly, it is possible to provide the display device 140 capable of realizing frame narrowing and an excellent heat radiation property.

In addition, since the support substrate 57 is a simple flat plate, the support frame can be efficiently manufactured by press working. Thus, it is possible to suppress cost of parts.

In addition, the total thickness of the adhesive layers 60 and 61 and the support frame 57 of the suitable example is about 2.0 mm, and the half (about 1.0 mm) of the total thickness and the bending radius Rb (about 1.0 mm) of the inside of the device substrate 1 are substantially equal.

Accordingly, it is possible to prevent the device substrate 1 from being bent while exceeding the allowable bending radius R by the total thickness. In other words, by setting the total thickness of the adhesive layers 60 and 61 and the support frame 57 to suit the allowable bending radius R of the device substrate 1, it is possible to simply realize frame narrowing in the range of the allowable bending radius R of the device substrate 1.

In addition, the total thickness (excluding the magnet sheet 66) of the display device 140 of the suitable example is about 2.4 mm, which is less than the total thickness (excluding the protrusion 56, about 3.9 mm) of the display device 120 of Embodiment 3.

Accordingly, it is possible to provide the display device 140 capable of realizing both thinness and frame narrowing.

Embodiment 5

Figure 15A:
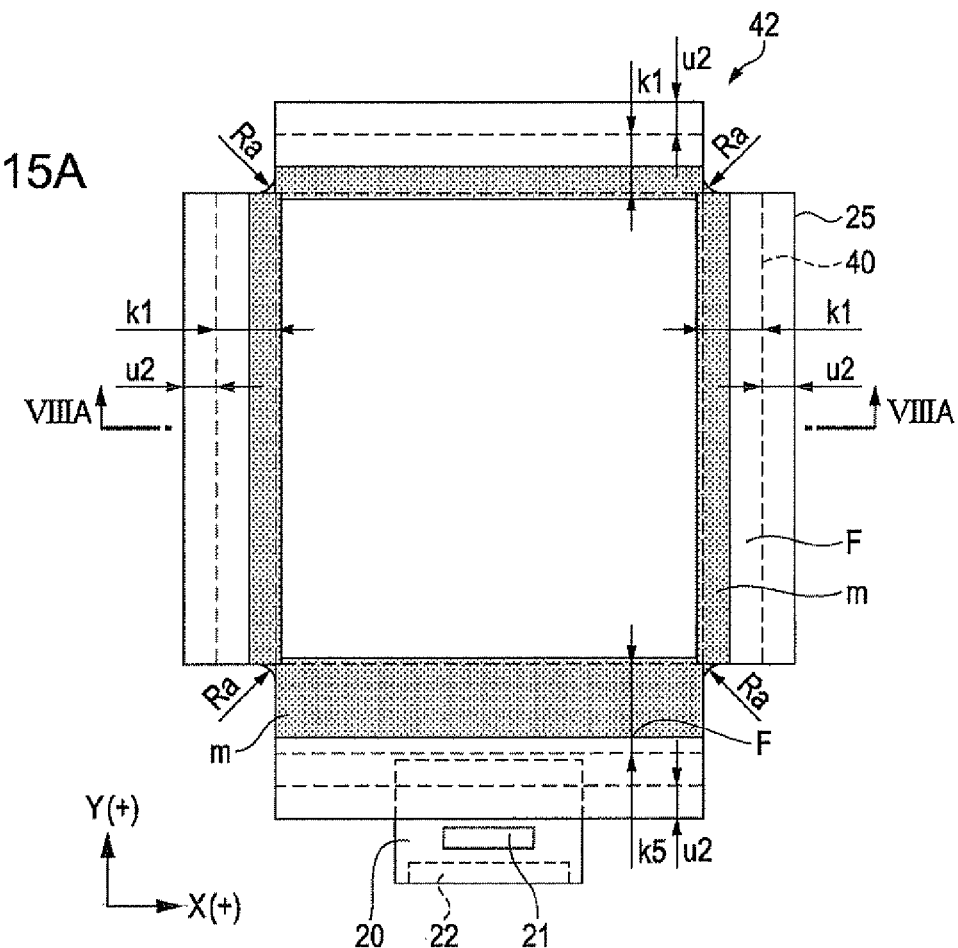
FIG. 15A is a plan view showing a display panel of Embodiment 5 and FIG. 15B is a diagram showing a manufacturing step of a laminate process.

FIG. 15A is a plan view showing a display panel of Embodiment 5, which corresponds to FIG. 10. FIG. 153 is a diagram showing a manufacturing step of a laminate process of the display panel. FIG. 8A is a side cross-sectional view taken along line XIIIA-XIIIA of FIG. 15A.

Hereinafter, the display panel according to Embodiment 5 of the invention will be described. In addition, the same components as Embodiments 1 to 4 are denoted by the same reference numerals and the description thereof will be omitted.

The display panel 42 according to Embodiment 5 includes a configuration in which the display panel 40 of Embodiment 3 is laminated by resin films 25a and 25b from the surface of the counter substrate 16 side and the surface of the device substrate 1, as shown in FIG. 8A. In other words, the resin films 25a and 25b for laminating the display panel 40 from the front and rear surfaces thereof are included.

FIG. 15A is a plan view of the display panel 42 in a single item state.

Although the display panel 40 is basically equal to the display panel 40 of Embodiment 3, the length of the flexible substrate 20 is slightly increased. In detail, the length of the flexible substrate is increased by the length u2 of the pasting portion (laminating portion) in the (−) direction of the Y axis. Although described in detail later, this is because the driving IC 21 is exposed from the laminate structure 25.

The planar size of the laminate structure 25 is greater than that of the display panel 40 by the pasting portions (laminating portions). In detail, all four sides are increased by the length (width) u2 from the outer shape of the display panel 40. That is, the length of the frame region F of each side is increased by the length u2.

The angular radius Ra portions (including notched portions) of the four corners of the display region V are not laminated and have the same shape as the outer shape of the display panel 40.

Regarding Material and Dimension of Resin Film, Laminate Method, and the Like

The material, the dimension and the laminate method of the two resin films 25a and 25b configuring the laminate structure 25, the action of the laminate structure and the like are equal to those of the description of Embodiment 2 (FIGS. 7 and 8).

Figure 15B:
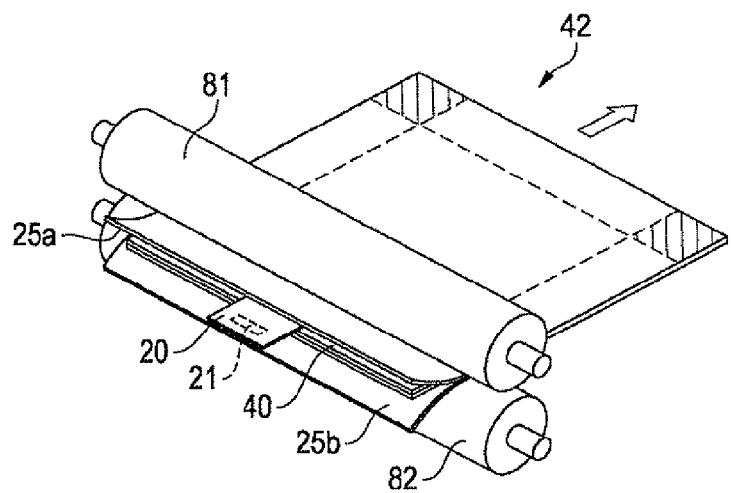

In addition, the angular radius Ra portions (including the notched portions) of the four corners of the display region V denoted by hatching of FIG. 15B are cut out after laminate. Alternatively, the resin films 25a and 25b in a state in which the portions are notched in an initial step may be used.

In the case where the display panel 42 of the present embodiment is applied to the bending structure of Embodiment 3 or the folding-back structure of Embodiment 4, the thicknesses of the support frames 50 and 57, the lengths of the frame regions F of the display panels 40 and 41, and the like may be appropriately adjusted according to the size or use of the display panel, requirements and the like.

As described above, in the case where the display panel having the laminate structure of the present embodiment is applied to the bending structure of Embodiment 3 or the folding-back structure of Embodiment 4, the following effects can be obtained in addition to the effects of the above-described Embodiments.

In addition, since the display panel 42 having the configuration in which the display panel 40 is laminated by the laminate structure 25 is applied to the bending structure of Embodiment 3 or the folding-back structure of Embodiment 4, it is possible to improve bending resistance.

In addition, it is possible to enhance an external permeation by moisture preventing property. Since mechanical impact is softened, it is possible to improve a treatment property.

Accordingly, it is possible to provide the display device capable of realizing both reliability securing and frame narrowing.

In general, although the connection portion between the extension region of the display panel 40 and the flexible substrate 20 is reinforced according to a molding agent such as silicon resin (adhesive) covering the connection portion, the connection portion may be easily peeled.

In contrast, according to the display panel 42, since the reinforcement configuration is obtained by the laminate using the resin films 25a and 25b, manufacturing efficiency is good. Since the connection portion and the display panel 41 are adhered (filled) by the same resin, it is possible to secure sufficient practical strength (toughness) without spoiling pliability.

In addition, since the polyethylene-based adhesive layer used in the resin films 25a and 25b are excellent in an insulation property, a moisture-proof property and a heat-resisting property, it is possible to secure sufficient electrical reliability.

Electronic Apparatus 1

Figure 16:
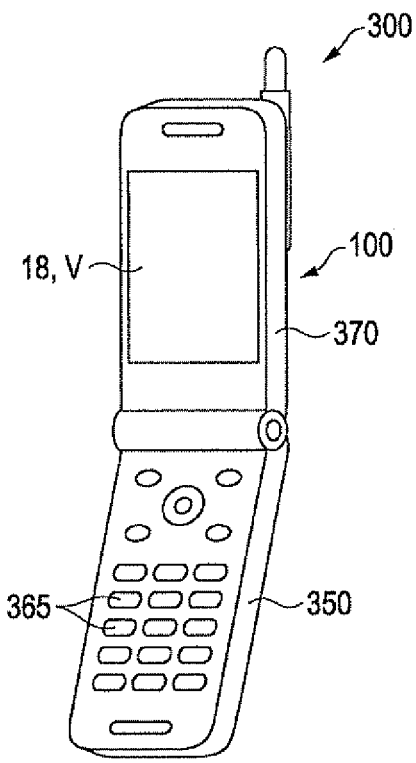
FIG. 16 is a perspective view showing a mobile phone as an electronic apparatus.

FIG. 16 is a perspective view showing a mobile phone including the display device mounted therein.

The display device 100 according to Embodiment 1 may be mounted and used, for example, in the mobile phone 300 as an electronic apparatus.

The mobile phone 300 includes a main body portion 350 and a display portion 370 which is openably and closably provided on the main body portion, and includes the display device 100 mounted therein. In detail, the display device 100 is assembled in the display unit 370 and the display panel 18 becomes a display screen.

In the main body portion 350, an operation portion 365 having a plurality of operation buttons is provided.

The mobile phone 300 is designed such that the distance (frame) from the display region V to the side surface of the display portion 370 is chipped off in order to make the display unit 370 look slim. Accordingly, the display device 100 capable of realizing frame narrowing is employed so as to realize frame narrowing.

In addition, instead of the display device 100, the display device 110, 120 or 140 may be used. Even through this configuration, it is possible to similarly realize frame narrowing.

The mode of the mobile phone is not limited to a foldable type shown in FIG. 16 and any mobile phone including the display panel may be used.

For example, a mobile phone in which the display portion 370 is foldably and rotatably provided on the main body portion 350 may be used. Alternatively, an integral type mobile phone or a slide-type mobile phone in which an operation portion is contained in an integral type main body portion may be used.

The electronic apparatus is not limited to the mobile phone and is applicable to an electronic apparatus including the display panel.

For example, the invention is applicable to various electronic apparatuses such as a display device for a car navigation system, a Personal Digital Assistant (PDA), a mobile computer, a digital camera, a digital video camera, an on-vehicle apparatus and an audio apparatus.

Electronic Apparatus 2

Figure 17:
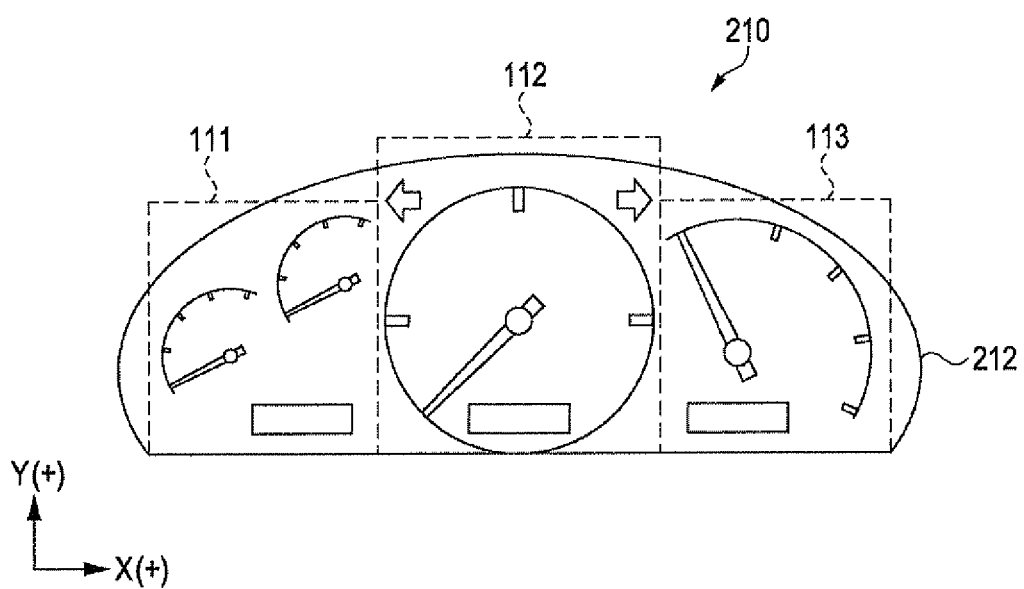
FIG. 17 is a plan view showing an on-vehicle meter as an electronic apparatus.

FIG. 17 is a plan view showing an on-vehicle meter including the display device mounted therein.

The display device 140 according to Embodiment 4 may be mounted and used, for example, in the on-vehicle meter 210 as an electronic apparatus.

The on-vehicle meter 210 includes three display devices 140 which are laterally aligned. In detail, the display device 111, the display device 112 and the display device 113 are arranged in this order from the left. In addition, the outer shape of the display device is denoted by a dotted line.

The display device 112 located on the central portion has a panel size greater than those of the left and right display devices 111 and 113. One on-vehicle meter exposed from an opening 212 of a dashboard is configured by the three display devices. In other words, one on-vehicle meter exposed from the opening 212 having a horizontally-long elliptical shape and a linearly cut bottom is configured by tiling the three display devices 111, 112 and 113 in the horizontal direction.

In the left display device 111, for example, a fuel meter, a moisture temperature meter, and the like are displayed.

In the central display device 112, for example, a speed meter, a direction indicator, and the like are displayed.

In the right display device 113, for example, a rotation meter and the like are displayed. Although an analogy display state is shown in FIG. 17, a digital display can be performed by operating a switch (not shown).

Synthetic displays using the three display devices are in close contact with each other and require seamlessness. Accordingly, the display device 140 capable of realizing frame narrowing is employed so as to realize frame narrowing.

Instead of the display device 140, the display device 120 of Embodiment 3 may be used. Alternatively, a combination thereof may be used. Even through this configuration, it is possible to similarly realize tiling and frame narrowing.

In addition, the plurality of display devices is not limited to be used for tiling, and a configuration in which one display panel is used is applicable to an electronic apparatus requiring frame narrowing.

For example, the display panel may be suitably used in a compact mobile phone with a relatively large display screen. In addition, in the mode of the mobile phone, a foldable type mobile phone in which a display portion is foldably provided on a main body portion or a mobile phone in which a display portion is foldably and rotatably provided on a main body portion may be used. Alternatively, an integral type mobile phone or a slide-type mobile phone in which an operation portion is contained in an integral type main body portion may be used.

The electronic apparatus is not limited to the mobile phone and is applicable to an electronic apparatus including the display panel. For example, the invention is applicable to various electronic apparatuses such as a display device for a car navigation system, a Personal Digital Assistants (PDA), a mobile computer, a digital camera, a digital video camera, an on-vehicle apparatus and an audio apparatus.

Electronic Apparatus 3

Figure 18A:
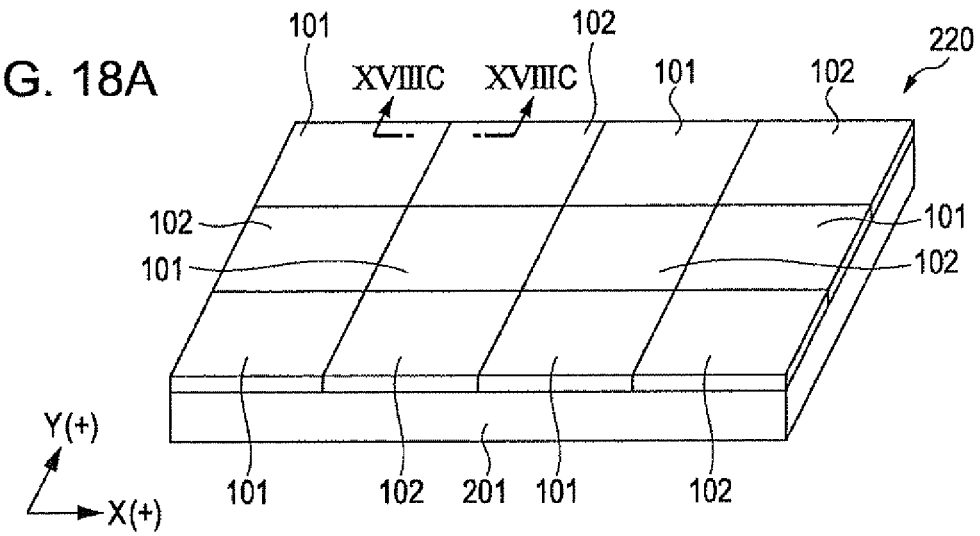
FIG. 18A is a perspective showing a second multi-display device as an electronic apparatus.
Figure 18B:
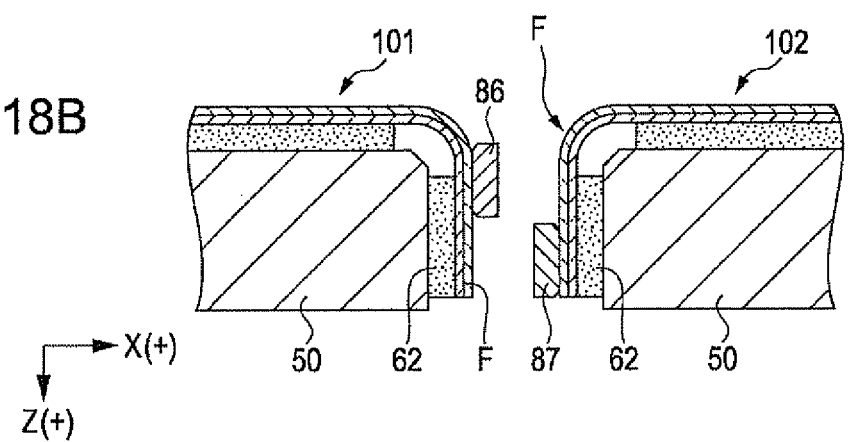
FIG. 18B is a side cross-sectional view of a display device.
Figure 18C:
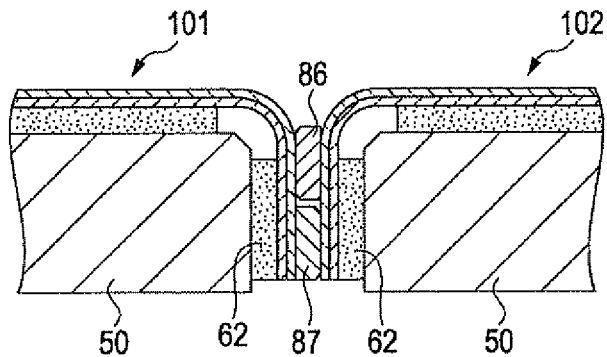
FIG. 18C is a side cross-sectional view taken along line XVIIIC-XVIIIC of FIG. 18A.

FIG. 18A is a perspective view showing a second multi-display device including the display device mounted therein, which corresponds to FIG. 11. FIG. 18B is a side cross-sectional view of the display device, which corresponds to FIG. 9C. FIG. 18C is a side cross-sectional view taken along line XVIIIC-XVIIIC of FIG. 18A.

Now, the multi-display device 220 having a connection configuration of a display device different from that of the above-described multi-display device 200 will be described.

The multi-display device 220 as an electronic apparatus includes a configuration in which a plurality of display devices 120 is tiled so as to form a horizontally-long large screen having an aspect ratio of 4:3.

The seat portion 201 of the multi-display device 220 is equal to the seat portion 201 of Embodiment 3 and the configuration of the plurality of display devices 120 is different from that of Embodiment 3.

In detail, as shown in FIG. 18B, each display device 120 includes bezels 86 and 87 for pressing the frame region F from the outside to the support frame 50 side. The bezels 86 and 87 have the same function as the tape member 85 of Embodiment 3, but the names thereof are changed by the attachment positions of the bezels in the thickness direction (Z-axis direction).

In FIG. 18B, the bezel placed on the upper side (the (−) direction of the Z axis) of the side surface of the support frame 50 is the bezel 86 and the display device in which this bezel is mounted is the display device 101.

The bezel placed on the lower side (the (+) direction of the Z axis) of the side surface of the support frame 50 is the bezel 87 and the display device in which this bezel is mounted is the display device 102.

In addition, although the bezels 86 and 87 of a suitable example are rings made of metal, the other members described in Embodiment 3 may be used. The height of the bezels 86 and 87 in the Z-axis direction are set to about half the thickness of the support frame 50. The corners of the inner circumference sides (frame region F side) of the bezels 86 and 87 are chamfered.

FIG. 18C is a side cross-sectional view of the neighboring display device 101 and display device 102 tiled in the seat portion 201. As shown in the drawing, the bezel 86 and the bezel 87 are aligned between the tiled display device 101 and display device 102 in the upper-and-lower direction (vertical direction) so as not to be superposed in the left-and-right direction (horizontal direction). Accordingly, it is possible to decrease a gap between the neighboring display devices. In other words, it is possible to realize frame narrowing.

As shown in FIG. 18A, when the display devices 101 and 102 are tiled, the display devices are alternately arranged in a row direction and a column direction. In addition, when the display devices are set in the seat portion 201, the display devices 101 are set after all the display devices 102 are set.

According to the display devices 101 and 102, since the bezels 86 and 87 are included, it is possible to fix the frame region F to the side surface of the support frame 50 with more certainty. The bezels 86 and 87 function as an impact buffer member when the side surface is contacted at the time of treatment or tiling. Thus, convenience and reliability are excellent.

Accordingly, according to the multi-display device 220, since the display devices 101 and 102 are included, it is possible to realize both frame narrowing and high reliability.

Although the case where the aspect ratio is 4:3 is described in FIG. 18A, according to the multi-display device 220, it is possible to simply configure a large screen having a desired aspect ratio by partitioning the seat portion 201 in a matrix.

Although the flexible print substrate is connected to the terminal 22 (FIG. 10) of the flexible substrate 20 of each display device such that the substrate is connected to the controller in the seat portion 201 through a wiring in Embodiment 3, the substrate may be wirelessly connected to the controller.

In detail, in every display device, a small controller, a power source circuit, a wireless LAN terminal and an antenna for the terminal are included. In the power source circuit, a power receiving coil or a power receiving module including a secondary battery is included.

In the seat portion 201, a main controller, a wireless LAN terminal, and an antenna for the terminal are included. In every partitioned region, a power transmission module including a power transmission coil for transmitting power to the power circuit of the display device by electromagnetic induction in a non-contact manner is arranged.

According to this configuration, a control signal including an image signal or the like is wirelessly transmitted from the main controller to each display device by the wireless LAN, and the power of each display device is supplied from the power transmission module provided in every partitioned region in the non-contact manner.

Accordingly, when the display device is set in the seat portion, since the display device is only fixed in every partitioned region, it is possible to reduce troublesome work such as wiring.

Since communication is possible within a communication area of the wireless LAN, for example, the main controller may be mounted on a place separated from the multi-display device.

According to this configuration, even when the multi-display device is provided anywhere in the communication area, it is possible to display desired information without requiring wiring processing or the like.

Accordingly, it is possible to provide a convenient multi-display device.

The invention is not limited to the above-described embodiments and the above-described embodiments may be variously modified or changed. Modified Examples will be described as follows.

Modified Example 1

Figure 19:
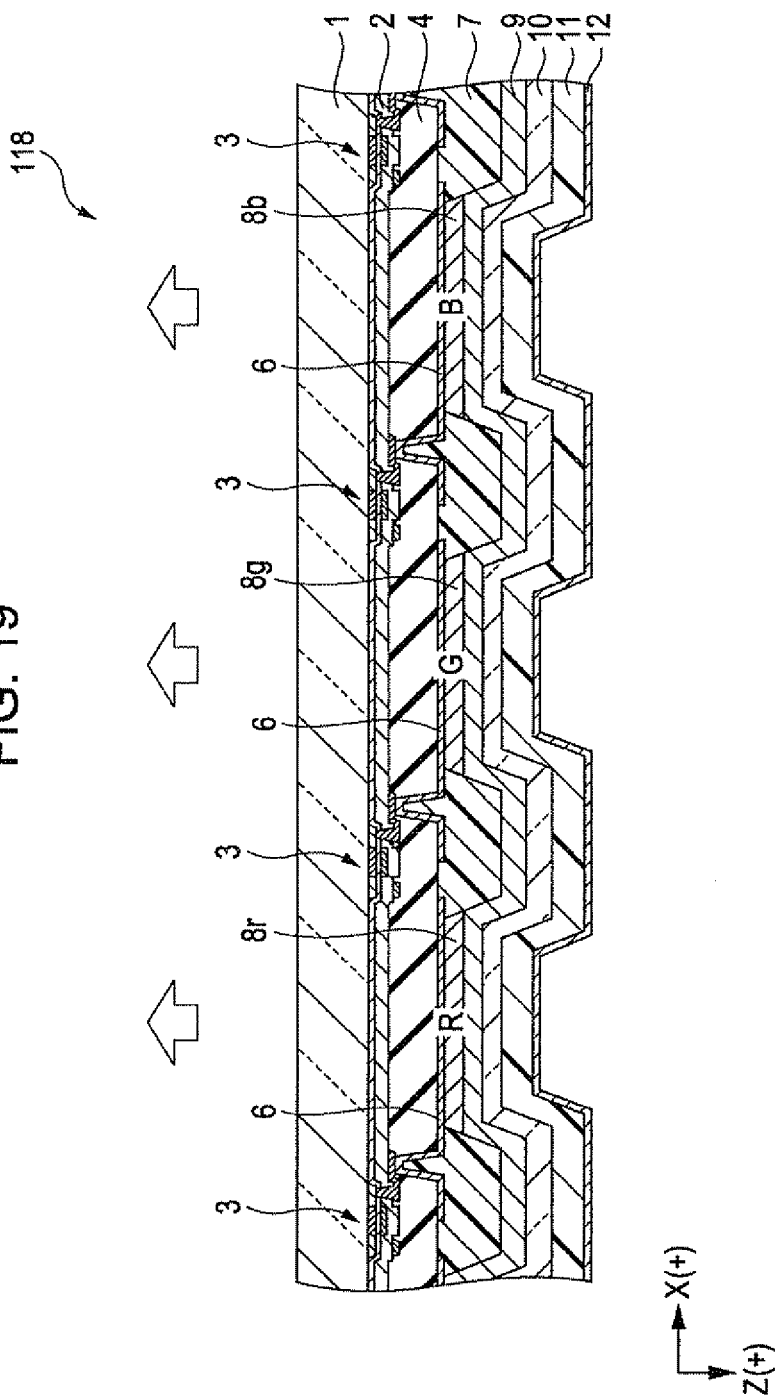
FIG. 19 is a side cross-sectional view of a display panel of Modified Example 1.

FIG. 19 is a side cross-sectional view of a display panel of Modified Example 1, which corresponds to FIG. 3.

Although the configuration in which two glass substrates are used in the display panel is described in the embodiments, the invention is not limited thereto and at least one glass substrate may be used. In addition, the same components as Embodiments 1 are denoted by the same reference numerals and the description thereof will be omitted.

A display panel 118 of Modified Example 1 is a bottom emission type organic EL display panel having a configuration in which an organic EL layer and a barrier layer are laminated on a device substrate 1 formed of glass. Accordingly, the lamination order (top and bottom) is reversed as compared with the display panel 18 of FIG. 3 and the device substrate 1 is located on the uppermost side (the (−) side of the Z axis). In addition, the device substrate 1 becomes a display surface and display light is emitted from the device substrate 1 side as denoted by the void arrows.

The display panel 118 includes the device substrate 1, a device layer 2, a planarization layer 4, pixel electrodes 6, a partitioning wall 7, an organic EL layer 8 functioning as an electro-optical layer, a common electrode 9, an electrode protective layer 10, a buffer layer 11, a gas barrier layer 12, and the like. The material, configuration or the like of each portion are equal to that of the description of Embodiment 1.

In the present modified example, as a suitable example, organic EL layers 8*r*, 8*g* and 8*b* of red, green and blue are formed by a three separately coloring system using an ink jet method using a high molecular material. For example, with respect to the blue organic EL layer 8*b*, a polyfluorene derivative is used as a light emitting layer using a PEDOT/PSS as a hole injection layer and using a TFB as a hole transport layer. With respect to each of the red and green organic EL layers 8*r* and 8*g*, a high molecular material for generating red or green is used.

In the case where this display panel 118 is applied to each embodiment, since the gas barrier layer 12 side faces the support frame 50 or 57, the adhesive layer 60 is preferably adhered to the entire surface in order to perform the function of the counter substrate with respect to the support frame and the support substrate.

Even in the case where this display panel 118 is applied to each embodiment, since bending is similarly possible, the same effects as each embodiment can be obtained. Since the function of the counter substrate is performed with respect to the support frame and the support substrate, it is possible to secure the same reliability as each embodiment.

A display panel having a configuration using a so-called three separately coloring system, in which the color filter is removed from the configuration of the display panel of each embodiment and RGB light emitting layers are respectively formed in RGB color pixels may be used.

Although the display panel of each embodiment is of an active matrix type, a passive (simple) matrix type display panel may be used.

In this case, the device layer 2 is not necessary and the organic EL layer 8 is interposed between scanning electrodes and data electrodes. For example, the scanning electrodes are formed on the device substrate 1 side and the data electrodes are formed on the counter substrate 16 side. In addition, the scanning electrodes and the data electrodes are formed so as to extend in crossing directions in a lattice shape in plan view.

Even through this configuration, the same effects as each embodiment can be obtained.

Modified Example 2

The description will be made with reference to FIG. 9C.

Although the display region V is formed in a planar portion in each embodiment, the display area V may be overlaid with the bending radius Rb. In other words, the display region V may include a bent portion.

According to this configuration, since the end of the frame region F includes a curved portion of the bending radius Rb of FIG. 9C, the length k2 of the frame region F is decreased so as to realize frame narrowing. In addition, this configuration is applicable to the configuration of FIG. 14B so as to similarly realize frame narrowing.

In the portion of the display region V overlaid on the curved portion of the bending radius Rb, for example, the display luminance of the pixel is higher than that of the planar portion, such that the planar display state is made uniform. In other words, by setting the display driving condition of the display region V overlaid on the curved portion of the bending radius Rb to be different from that of the planar portion, it is possible to make the display image uniform. In the curved portion of the bending radius Rb, the display is driven such that the display luminance of the pixel is gradually increased with gradation as it is separated from a portion close to the display region V (planar portion).

That is, in a configuration in which the panel is bent or folded back from the vicinity of the circumference of the display region V, it is possible to realize frame narrowing.

Modified Example 3

FIG. 20 is a side cross-sectional view of a display panel of Modified Example 3, which corresponds to FIG. 3.

Although the display panel is the organic EL panel in each embodiment, the invention is not limited thereto and at least one glass substrate may be used. In addition, a thin display panel having an electro-optical layer may be used. For example, an electrophoretic panel having an electrophoretic layer as an electro-optical layer may be used.

Hereinafter, a display panel 128 according to Modified Example 3 will be described. In addition, the same components as FIG. 3 are denoted by the same reference numerals and the description thereof will be omitted.

The display panel 128 of the present embodiment is a reflection type electrophoretic panel including an electrophoretic layer 97 as an electro-optical layer.

The display panel 128 has a configuration in which the electrophoretic layer 97 is interposed between the device substrate 1 and the counter substrate 95. The lamination structure from the device substrate 1 to the pixel electrodes 6 is equal to that of the configuration of FIG. 3.

The counter substrate 95 is, for example, a transparent substrate formed of glass, plastic or the like. A counter electrode 94 is entirely (solidly) formed on the counter substrate 95 at the device substrate 1 side so as to face the plurality of pixel electrodes 6. The counter electrode 94 is formed of a transparent conductive material such as ITO.

The electrophoretic layer 97 includes a plurality of microcapsules 90, a binder 92 for holding the microcapsules, an adhesive layer 91, and the like. In addition, the display panel 128 is formed by adhering an electrophoretic sheet, in which the electrophoretic layer 97 is fixed to the counter substrate 95 side by the binder 92, and the device substrate 1 manufactured independent of the sheet and having the pixel electrodes 6 or the like formed thereon by an adhesive layer 91.

One or the plurality of microcapsules 90 is interposed between the pixel electrodes 6 and the counter electrode 94 and is placed in one pixel (in other words, one pixel electrode 6).

As shown in an enlarged diagram located on the right upper side of FIG. 20, the microcapsule 90 includes a configuration in which a dispersion medium 78, a plurality of white particles 76, and a plurality of black particles 77 are sealed in a coated layer 75. The microcapsule 90 is formed, for example, in a spherical shape with a particle diameter of about 50 μm.

The coated layer 75 is formed of high molecular resin having a light transmission property, such as acrylic resin, urea resin, Arabian gum or gelatin.

The dispersion medium 78 is a medium for dispersing the white particles 76 and the black particles 77 in the microcapsule 90 (in other words, the coated film 75).

The white particles 76 are particles (high molecules or colloid) formed of, for example, a white pigment such as titanium dioxide, Chinese white (zinc oxide) or antimony trioxide and are negatively charged.

The black particles 77 are particles (high molecules or colloid) formed of, for example, a black pigment such as aniline black or carbon black and are positively charged.

Accordingly, since the white particles 76 and the black particles 77 are moved in the dispersion medium 78 by an electric field (potential difference) generated by the potential difference between the pixel electrodes 6 and the counter electrode 94, the hue of the particles collected on the counter electrode 94 side is displayed.

In addition, the pigments used in the white particles 76 and the black particles 77 are replaced with, for example, red, green and blue pigments so as to perform a color display of red, green and blue.

In addition, the invention is not limited to the microcapsule type and an electron powder fluid type electrophoretic panel for inserting electron powder fluid having charging properties into the pixel and switching plus/minus so as to control the switch on/off of the display may be used. Alternatively, an electrophoretic panel using cholesteric liquid crystal may be used.

Even through this configuration, the same effects as each embodiment can be obtained.

Modified Example 4

Figure 21A:
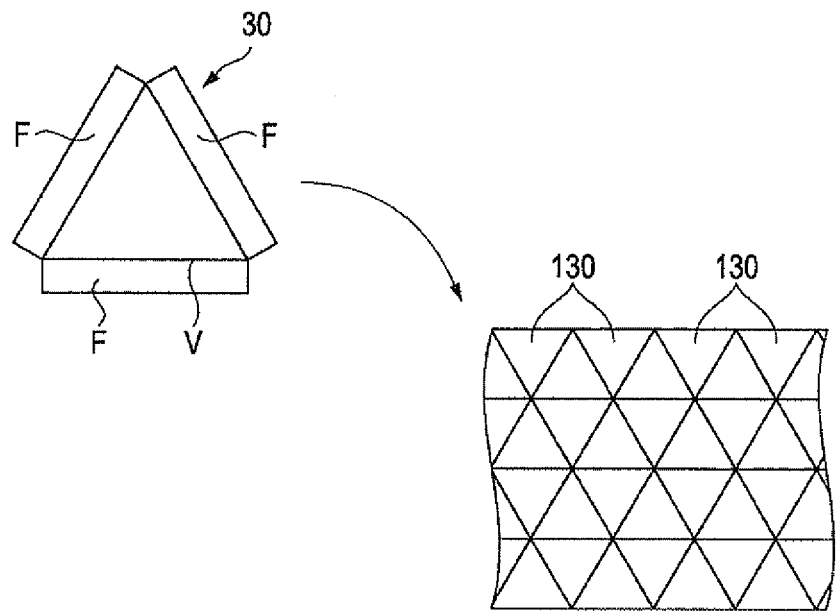
FIG. 21A is a plan view showing a display panel of Modified Example 4 and a tiling shape of a display device including the display panel and FIG. 21B is a plan view showing a display panel of another example and a tiling shape of a display device including the display panel.
Figure 21B:
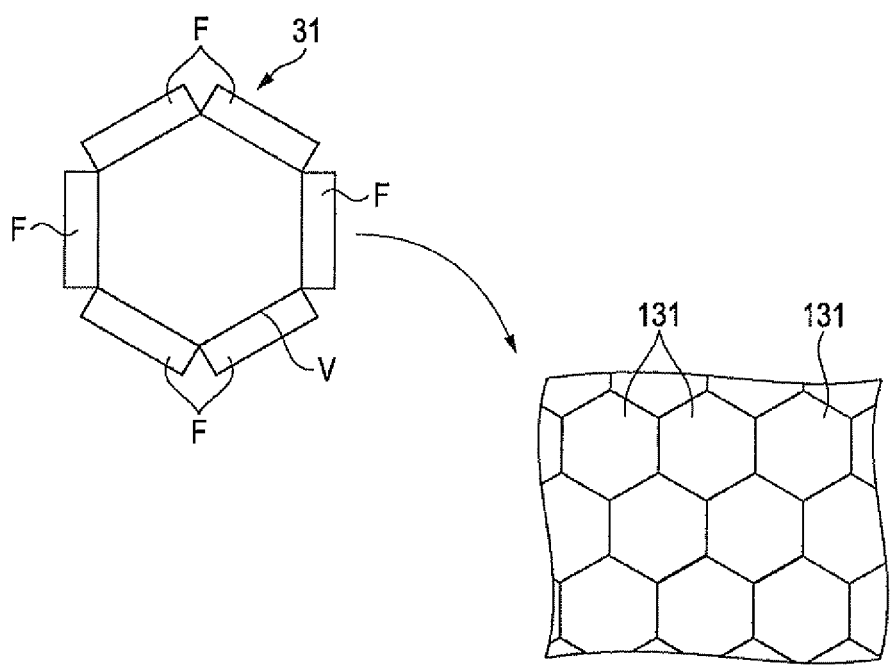

FIG. 21A is a plan view showing a display panel of Modified Example 4 and a tiling shape of a display device including the display panel. FIG. 21B is a plan view showing a display panel of another example of Modified Example 4 and a tiling shape of a display device including the display panel.

Although the display region V (the planar shape of the display device) has a rectangular shape including a square in each embodiment, the invention is not limited thereto and a polygon which can be tiled may be used.

Hereinafter, a display panel according to Modified Example 4 and the tiling shape of the display device will be described with reference to FIGS. 21A and 21B. In addition, the same components as each embodiment are denoted by the same reference numerals and the description thereof will be omitted.

The display panel 30 of FIG. 21A includes substantially a regular triangular display region V. In addition, the outer shape of the display device 130 in which the display panel 30 is applied to the bending structure of Embodiment 3 or the folding-back structure of Embodiment 4 has substantially a regular triangular shape. In addition, the laminate structure of Embodiment 5 may be applied to the display panel 30.

Even through this configuration, as shown in the right lower side of FIG. 21A, the plurality of display devices 130 is tiled so as to configure a seamless large screen. In addition, the shape of the display region V is not limited to the regular triangle and a triangle which can be aligned without a gap as a figure, such as an isosceles triangle, may be used.

The display panel 31 of FIG. 21b includes substantially a regular hexagonal display region V. In addition, the outer shape of the display device 131 in which the display panel 31 is applied to the bending structure of Embodiment 3 or the folding-back structure of Embodiment 4 has substantially a regular hexagonal shape. In addition, the laminate structure of Embodiment 5 may be applied to the display panel 31.

Even through this configuration, as shown in the right lower side of FIG. 21B, the plurality of display devices 131 is tiled so as to configure a seamless large screen. In addition, the shape of the display region V is not limited to the rectangle, the triangle and the regular hexagon, and a shape which can be aligned without a gap as a figure, such as a rhombus or a trapezoid, may be used.

In such polygons, by bending the frame region F of each side of the display panel from the vicinity of the circumference of the display region V to the support frame side so as to be fixed to the side surface of the support frame or folding the frame region back so as to be fixed to the rear surface of the support frame, it is possible to realize frame narrowing and to configure a seamless large screen by tiling.

That is, the same effects as each embodiment can be obtained.

Modified Example 5

The description will be made with reference to FIGS. 2 and 3.

Although the organic EL display panel which includes the plurality of pixels so as to display the image according to the image signal is described as an electro-optical device in the embodiments and the modified examples, the display panel is used as an illumination panel so as to configure an illumination device as the electro-optical device.

For example, in the case where the display panel 18 of FIG. 2 is used as the illumination device, the display region V is read as a light emitting region V and uniform white light is emitted from the entire surface of the light emitting region V. In detail, in FIG. 3, the number of pixel electrodes is 1 and the size thereof is equal to that of the light emitting region V such that the organic EL layer 8 is interposed between the common electrode 9 and the pixel electrode. In other words, the structure of the display (illumination) panel is a simple passive structure in which the organic EL layer 8 (light emitting layer) is interposed between a pair of pixel electrodes and common electrode 9. In this configuration, the configurations necessary for the active type image display, such as the driving transistor 3, the partitioning wall 7 and the CF layer 14, are not necessary.

The end of the common electrode 9 is bent to the device substrate 1 side and is electrically connected to the wiring for the common electrode formed on the substrate side through contact portions (all of which are now shown). In other words, the common electrode 9 covers the organic EL layer 8 (pixel electrode) such that the circumference thereof is in contact with the device substrate 1 side, and the circumference thereof is electrically connected to the wiring for the common electrode formed on the device substrate 1 side through the contact portions. Here, the wiring for the common electrode is preferably formed so as to surround the circumference of the light emitting region V of FIG. 2. In detail, in the frame region F of the illumination panel, the wiring for the common electrode is formed in a frame shape so as to surround the circumference of the light emitting region V. In particular, the wiring for the common electrode is formed so as to be superposed on the curved area m in the X-axis direction.

In addition, on the device substrate 1, the pixel electrode and the wiring for the common electrode are electrically and independently formed. In a suitable example, a notched portion is formed in the wiring for the common electrode surrounding the pixel electrode, and an anode wiring for supplying an anode potential to the pixel electrode is formed in the notched portion. Alternatively, in the thickness direction, an insulating layer may be formed between the pixel electrode and the wiring for the common electrode so as to electrically separate the pixel electrode and the wiring for the common electrode.

The contact portions for electrically connecting the wiring for the common electrode and the common electrode 9 are, for example, a conductive adhesive or a contact hole for structurally connecting the wiring for the common electrode and the common electrode, and the plurality of contact portions is provided along the wiring for the common electrode. As a suitable example, a plurality of contact holes is formed in one side of the frame region F. This is because, in particular, the deterioration of the emission luminance due to voltage drop in the central portion of the light emitting region V is suppressed in consideration of the (surface) resistance of the common electrode 9 made thin for securing light transmission.

By forming the plurality of contact holes in the circumference of the common electrode 9, the voltage drop in the central portion of the light emitting region V is suppressed such that substantially uniform white light is emitted from the entire region of the light emitting region V.

The illumination device having such a configuration may be, for example, suitably utilized in the application requiring thinness, such as a back light or a front light of a liquid crystal panel. The illumination device may be suitably utilized in the application requiring flexibility, such as an indoor illumination of an aircraft requiring lightweight or attachment to a curved portion of a vehicle cabin.

In addition, as shown in FIGS. 1A to 1C, by setting the illumination panel on the support frame 45, similarly to the description of Embodiment 1, it is possible to provide an illumination device capable of realizing frame narrowing in the horizontal direction.

Similarly, by a simple passive structure in which the organic EL layer 8 is interposed between a pair of pixel electrodes and common electrode 9, the display (illumination) panel 40 of FIG. 10 may be used as an illumination device. As shown in FIG. 9A to 9B, by setting the illumination panel on the support frame 50, similarly to the description of Embodiment 3, it is possible to provide an illumination device capable of realizing frame narrowing in the vertical and horizontal directions. In addition, by arranging (tiling) the illumination devices in a matrix, it is possible to realize a large flat illumination device shown in FIG. 11.

In addition, a contact hole may be added to the vicinity of the center of the light emitting region V by forming a linear notched portion from one side of the pixel electrode to substantially the central portion and extending and wiring the wiring for the common electrode in the notched portion. According to this configuration, it is possible to make emission luminance uniform.

A contact hole may be added to the vicinity of the center of the light emitting region V by halving the pixel electrodes and providing the wiring for the common electrode in a gap therebetween. Even through this configuration, the same effects can be obtained. In addition, the division number of the pixel electrode is not limited to 2 and may be plural.

Although the case where the invention is applied to a top emission type illumination panel has been described up to now, the same effect can be obtained even when the invention is applied to a bottom emission type illumination panel. Even in this case, a simple passive structure in which the organic EL layer is interposed between a pair of a pixel electrode and a common electrode is preferable. The organic EL layer may be any one of a low molecular material and a high molecular material. The light emitting color of the organic EL layer is not limited to off-white and an organic EL layer of various light emitting colors according to use may be formed.

Although the invention is treated as the illumination device, all display panels including the display panel 18 described in each embodiment and modified example may be used as an illumination panel. Since each display panel is an active matrix type organic EL panel capable of performing a full-color display, in the case where an illumination device is configured using the display panel, it is possible to perform illumination of all white, all red and all blue by, for example, supplying an image (illumination) signal defining a display of all white, all red and all blue. That is, it is possible to perform illumination of desired color light.

What is claimed is:

1. An electro-optical device comprising:
   a display panel that includes a first substrate and a second substrate, the first substrate and the second substrate having flexibility;
   a pixel disposed above the first substrate in a display region, the pixel having an electro-optical layer; and
   a support frame that supports the display panel,
   wherein the display panel in a frame region between a first edge of the display panel and the display region is bent and is fixed to the support frame.

2. The electro-optical device according to claim 1, wherein:
   a support portion supporting at least a portion of the display region and a storage portion for storing at least one side of the frame region are formed in the support frame, and
   the side is fixed in a state of being in contact with a sidewall formed in a crossing direction with respect to a surface including the display region of the storage portion.

3. The electro-optical device according to claim 2, wherein:

in side view, the surface including the display region and the bent portion are provided such that an angle formed with respect to the bent side is in a range of 90 to 120 degrees, and the bending radius of the glass substrate in the bent portion is 1.8 mm or less.

4. The electro-optical device according to claim 3, wherein at least two facing sides in the display region are bent.

5. The electro-optical device according to claim 1, wherein:

the support frame is formed with substantially the same area as the display region in plan view, and a front-surface adhesive layer for fixing the display panel is placed on a front surface of the display panel side of the support frame and a side-surface adhesive layer for fixing the frame regions is placed on a side surface of the support frame.

6. The electro-optical device according to claim 5, wherein:

the support frame is a plate-shaped member formed of metal, and a length of the frame region is 2 mm or more.

7. The electro-optical device according to claim 6, wherein:

the frame region is formed so as to extend from the side to the outside of the display region in every side of the display region, and a notched portion is formed between neighboring portions of the frame region on the outside of the display region.

8. The electro-optical device according to claim 7, further comprising a tape member or a bezel for pressing the bent portion from the outside to the side surface of the support frame.

9. An electronic apparatus including a plurality of electro-optical devices according to claim 8, comprising:

a display unit having a plurality of first electro-optical devices in which a first bezel is placed on an upper side which is the display panel side in the side surface and a plurality of second electro-optical devices in which a second bezel is placed on a lower side opposed to the upper side in the side surface, wherein, when the first electro-optical devices and the second electro-optical devices are aligned, the first and second bezels are arranged so as not to be superposed in a planar direction, and wherein the first electro-optical devices and the second electro-optical devices are alternately tiled and placed.

10. An electronic apparatus comprising the electro-optical device according to claim 1 as a display portion.

11. An electronic apparatus comprising a display unit having a plurality of electro-optical devices according to claim 1, wherein the plurality of electro-optical devices are tiled and placed such that the bent portions of adjacent ones of the electro-optical devices are adjacent to each other.

12. An electro-optical device comprising:

a display panel that includes a first substrate and a second substrate, the first substrate and the second substrate having flexibility;

a pixel that is disposed above the first substrate in a display region, the pixel having an electro-optical layer; and a support substrate that has a first surface opposed to the display panel and a second surface opposed to the first substrate, wherein the display panel in a frame region between a first edge of the display panel and the display region is bent, the first edge of the display panel contacting with the second surface of the support substrate.

13. The electro-optical device according to claim 12, wherein:

a front-surface adhesive layer for adhering the display panel and supporting the display panel is provided on the front surface of the support substrate and a rear-surface adhesive layer for adhering the folded-back side is provided on the rear surface, and a bending radius of the first and second substrates in the bent portion is substantially equal to half a thickness obtained by adding the thicknesses of the front-surface adhesive layer and the rear-surface adhesive layer to the thickness of the support substrate.

14. The electro-optical device according to claim 13, wherein:

the first and second substrates are glass substrates having substantially the same thickness and the electro-optical layer is interposed between the first substrate and the second substrate.

15. The electro-optical device according to claim 14, further comprising a resin film which covers and laminates the display panel from the first substrate side and the second substrate side.

16. The electro-optical device according to claim 15, wherein:

the frame region is formed so as to extend from a side of the electro-optical device to an outside of the display region in every side of the display region, a notched portion is formed between neighboring portions of the frame region on the outside of the display region.

17. The electro-optical device according to claim 16, further comprising:

a pixel circuit including a driving circuit for displaying and driving the pixel, the pixel circuit being formed in the frame region of the display panel, and a wiring portion for connecting the pixel and the pixel circuit is formed in the bent portion.

18. The electro-optical device according to claim 17, wherein the length of the frame region is 2 mm or more.

19. The electro-optical device according to claim 18, wherein the electro-optical layer is an organic EL layer including an organic light emitting layer.

20. An illumination device comprising:

a panel that includes a first substrate and a second substrate, the first substrate and the second substrate having flexibility;

a light emitting element that is disposed above the first substrate an a light emitting region; and a support frame that supports panel, wherein the panel in a frame region between a first edge of the panel and the light emitting region is bent and is fixed to the support frame.

* * * * *